United States Patent
Asatsuma

(10) Patent No.: US 9,978,786 B2
(45) Date of Patent: May 22, 2018

(54) SOLID-STATE IMAGE-CAPTURING DEVICE AND PRODUCTION METHOD THEREOF, AND ELECTRONIC APPLIANCE

(71) Applicant: SONY CORPORATION, Tokyo (JP)

(72) Inventor: Tomohiko Asatsuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days. days.

(21) Appl. No.: 14/900,242

(22) PCT Filed: Jun. 25, 2014

(86) PCT No.: PCT/JP2014/003401
§ 371 (c)(1),
(2) Date: Dec. 21, 2015

(87) PCT Pub. No.: WO2015/001769
PCT Pub. Date: Jan. 8, 2015

(65) Prior Publication Data
US 2016/0343753 A1    Nov. 24, 2016

(30) Foreign Application Priority Data
Jul. 3, 2013    (JP) .................................. 2013-139832

(51) Int. Cl.
*H01L 27/146* (2006.01)

(52) U.S. Cl.
CPC .... *H01L 27/14609* (2013.01); *H01L 27/1464* (2013.01); *H01L 27/14621* (2013.01);
(Continued)

(58) Field of Classification Search
None
See application file for complete search history.

(56) References Cited

U.S. PATENT DOCUMENTS

| 2012/0212662 A1* | 8/2012 | Shimoda | H04N 5/23212 348/349 |
| 2013/0015545 A1* | 1/2013 | Toumiya | H01L 27/14605 257/432 |

(Continued)

FOREIGN PATENT DOCUMENTS

| CN | 102881699 | 1/2013 |
| JP | 2008 071972 A | 3/2008 |

(Continued)

OTHER PUBLICATIONS

International Search Report and Written Opinion prepared by the European Patent Office dated Sep. 25, 2014, for International Application No. PCT/JP2014/003401.

(Continued)

*Primary Examiner* — Daniel Whalen
(74) *Attorney, Agent, or Firm* — Sheridan Ross P.C.

(57) ABSTRACT

A high degree of phase difference detection accuracy can be obtained using a phase difference pixel (2B) with a simpler configuration. A solid-state image-capturing device includes a pixel array unit in which a plurality of pixels including a phase difference pixel (2B) which is a pixel for focal point detection and an image-capturing pixel (2A) which is a pixel for image generation are arranged in a two-dimensional array. In this case, a predetermined layer (50) between a light shielding layer (47) and a micro lens (52) formed in the image-capturing pixel has a higher refraction index than a refraction index of the predetermined layer (51) formed in the phase difference pixel. The technique of the present disclosure can be applied to, for example, a back-illuminated-type solid-state image-capturing device and the like.

14 Claims, 19 Drawing Sheets

(52) U.S. Cl.
CPC .. *H01L 27/14623* (2013.01); *H01L 27/14627* (2013.01); *H01L 27/14685* (2013.01)

(56) References Cited

U.S. PATENT DOCUMENTS

| | | | |
|---|---|---|---|
| 2013/0021521 A1* | 1/2013 | Hamada | H04N 5/23212 348/360 |
| 2013/0222630 A1* | 8/2013 | Hashimoto | H01L 27/14806 348/222.1 |

FOREIGN PATENT DOCUMENTS

| | | |
|---|---|---|
| JP | 2011-210981 | 10/2011 |
| JP | 2012-151367 | 8/2012 |
| JP | 2012-151774 | 8/2012 |
| JP | 2012-173492 | 9/2012 |
| JP | 2015-005619 | 1/2015 |

OTHER PUBLICATIONS

Official Action (with English translation) for Chinese Patent Application No. 201480023244.X, dated Dec. 28, 2017, 12 pages.

* cited by examiner

SOLID-STATE IMAGE-CAPTURING DEVICE AND PRODUCTION METHOD THEREOF, AND ELECTRONIC APPLIANCE

CROSS REFERENCE TO RELATED APPLICATIONS

This application is a national stage application under 35 U.S.C. 371 and claims the benefit of PCT Application No. PCT/JP2014/003401 having an international filing date of Jun. 25, 2014, which designated the United States, which PCT application claimed the benefit of Japanese Patent Application No. 2013-139832 filed Jul. 3, 2013, the disclosures of which are incorporated herein by reference in their entirety.

TECHNICAL FIELD

The present disclosure relates to a solid-state image-capturing device, a production method thereof, and an electronic appliance, and more particularly relates to a solid-state image-capturing device, a production method thereof, and an electronic appliance capable of obtaining a high degree of phase difference detection accuracy using a phase difference pixel with a simpler configuration.

BACKGROUND ART

There is a solid-state image-capturing device in which a pixel array unit having multiple pixels arranged in an array form in a two-dimensional manner includes not only ordinary pixels for image generation (hereinafter referred to as image-capturing pixels) but also phase difference pixels for focal point detection.

In order to obtain a high degree of phase difference detection accuracy with the phase difference pixels, the sensitivity needs to be highly dependent on the angle so that the phase difference pixels receive only the incidence light of a desired angle and generates an associated output. In order to make the phase difference pixels of which sensitivities are highly dependent on the angle, it is most effective to increase the film thickness of an inter-layer film of a phase difference pixel (makes a thicker film).

However, when an inter-layer film is simply made thicker, the image-capturing pixels are also made into thicker films, and therefore, the image-capturing pixels would have a poor diagonal incidence property. More specifically, although it is desirable for the image-capturing pixel to receive light from a diagonal direction of which incidence angle is large, when the thickness of the film is increased, the light from diagonal direction may not be received and the sensitivity is reduced.

Therefore, a solid-state image-capturing device has been suggested to improve the detection accuracy of a phase difference pixel by employing a structure of the phase difference pixel which is different from the structure of the image-capturing pixel. For example, PTL 1 discloses a technique for making a structure of the phase difference pixel that is different from the structure of the image-capturing pixel by forming an in-layer lens in the phase difference pixel and embedding a high refraction index layer under the in-layer lens.

On the other hand, PTL 2 discloses an idea for changing the structure of the image-capturing pixel. More specifically, an inter-layer lens and a light guide are provided for the image-capturing pixel, so that, while the degradation of the characteristics of the image-capturing pixel is suppressed, the phase difference pixel is optimized, whereby the detection accuracy of the phase difference pixel is improved.

In order to obtain a high degree of phase difference detection accuracy using a phase difference pixel, a light shielding layer for pupil-splitting serves an important role. Therefore, PTL 3 discloses a solid-state image-capturing device that helps a light shielding layer by making the aperture width of a wiring layer of the uppermost layer of the phase difference pixel smaller than the aperture width of the image-capturing pixel.

CITATION LIST

Patent Literature

PTL 1: JP 2012-151367 A
PTL 2: JP 2008-71972 A
PTL 3: JP 2012-173492 A

SUMMARY OF INVENTION

Technical Problem

However, in the technique disclosed in PTL 1, the wave front is sharply bent, and this may increase the reflection loss at the light reception unit. In the technique disclosed in PTL 2, the image-capturing pixel is provided with the inter-layer lens and the light guide, and this may greatly increase the number of steps of production. Likewise, when the technique disclosed in PTL 3 is realized, at least wirings for two layers are necessary, and therefore, in particular, when this is applied to a back-illuminated solid-state image-capturing device, this may greatly increase the number of steps of production.

The present disclosure is made in view of such circumstances, and the present disclosure obtains a high degree of phase difference detection accuracy using a phase difference pixel with a simpler configuration.

Solution to Problem

A solid-state image-capturing device according to a first aspect of the present disclosure includes a pixel array unit having a plurality of pixels arranged in a two-dimensional array, the plurality of pixels including a phase difference pixel and an image-capturing pixel, and a layer between a light shielding layer and a micro lens formed in the image-capturing pixel, wherein the layer between the light shielding layer and the micro lens formed in the image-capturing pixel has a higher refraction index than a refraction index of a layer formed in the phase difference pixel.

In a production method for producing a solid-state image-capturing device having a plurality of pixels including a phase difference pixel and an image-capturing pixel according to a second aspect of the present disclosure, wherein the production method includes forming a light shielding layer in at least the image-capturing pixel, forming a first layer in the image-capturing pixel with a material having a higher refraction index than a refraction index of a first in the phase difference pixel, and forming a micro lens above the first layer.

An electronic appliance according to a third aspect of the present disclosure includes a solid-state image-capturing device including a pixel array unit having a plurality of pixels including a phase difference pixel and an image-capturing pixel arranged in a two-dimensional array, and a layer between a light shielding layer and a micro lens formed in the image-capturing pixel, wherein the layer between the light shielding layer and the micro lens formed in the image-capturing pixel has a higher refraction index than a refraction index of a layer formed in the phase difference pixel.

In the first to the third aspects of the present disclosure, in the pixel array unit in which the plurality of pixels including the phase difference pixel which is the pixel for focal point detection and the image-capturing pixel which is the pixel for image generation are arranged a two-dimensional array, the layer between the light shielding layer and the micro lens formed in the image-capturing pixel has a higher refraction index than the refraction index of the layer formed in the phase difference pixel.

An electronic appliance according to a fourth aspect of the present disclosure includes a solid-state image-capturing device including a pixel array unit having a plurality of pixels including a phase difference pixel and an image-capturing pixel arranged in a two-dimensional array, wherein an aperture shape of a light shielding layer of the phase difference pixel is a shape for shielding light in areas in proximity to the four corners of a rectangular pixel area.

In the fourth aspect of the present disclosure, in the pixel array unit in which the plurality of pixels including the phase difference pixel which is the pixel for focal point detection and the image-capturing pixel which is the pixel for image generation are arranged in a two-dimensional array, the aperture shape of the light shielding layer of the phase difference pixel is the shape for shielding light in areas in proximity to the four corners of the pixel area.

The solid-state image-capturing device and the electronic appliance may be independent devices, or may be modules incorporated into other devices.

Advantageous Effects of Invention

According to the first to the fourth aspects of the present disclosure, a high degree of phase difference detection accuracy can be obtained using a phase difference pixel with a simpler configuration.

DESCRIPTION OF EMBODIMENTS

Figure 1:
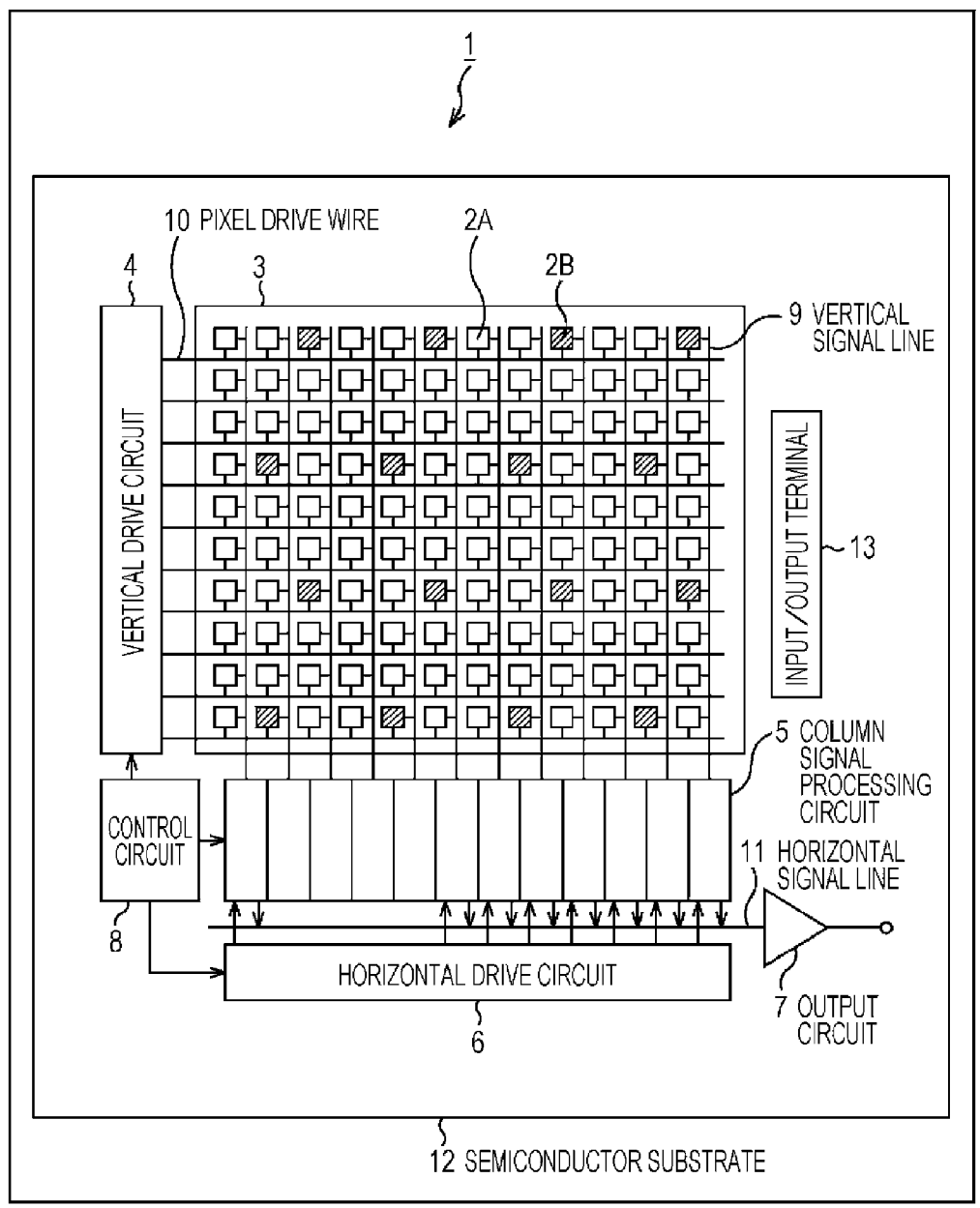
FIG. 1 is a figure illustrating a schematic configuration of a solid-state image-capturing device according to an embodiment of the present disclosure.

Modes for carrying out the present disclosure (hereinafter referred to as embodiments) will be explained. It should be noted that the explanation will be made in the following order.

1. Example of schematic configuration of solid-state image-capturing device according to an embodiment of the present disclosure
2. First embodiment of pixels (embodiment in which high refraction index layer and low refraction index layer are disposed between color filter layer and micro lens)
3. Second embodiment of pixels (embodiment in which planarization film is disposed between high refraction index layer, low refraction index layer, and micro lens)
4. Third embodiment of pixels (embodiment in which high refraction index layer and low refraction index layer are disposed between color filter layer and planarization film)
5. Fourth embodiment of pixels (embodiment in which color filter layer is high refraction index layer)
6. Fifth embodiment of pixels (embodiment in which transparent color filter layer is low refraction index layer)
7. Aperture shape of light shielding layer
8. Modification of aperture width of light shielding layer
9. Modification of aperture direction of light shielding layer
10. Modification of aperture shape of light shielding layer
11. Example of application to front-illuminated type
12. Example of configuration of electronic appliance according to an embodiment of the present disclosure <1. Example of Schematic Configuration of Solid-State Image-Capturing Device>

FIG. 1 illustrates a schematic configuration of a solid-state image-capturing device according to an embodiment of the present disclosure.

A solid-state image-capturing device 1 of FIG. 1 includes a pixel array unit 3, in which pixels 2 are arranged in an array form in a two-dimensional manner, and a peripheral circuit unit therearound, which are provided on a semiconductor substrate 12 using silicon (Si) as semiconductor, for example. The peripheral circuit unit includes, for example, a vertical drive circuit 4, a column signal processing circuit 5, a horizontal drive circuit 6, an output circuit 7, a control circuit 8, and the like.

In the pixel array unit 3, the pixels 2 arranged in an array form in a two-dimensional manner include image-capturing pixels 2A for generating a signal for image generation and phase difference pixels 2B for generating a signal for focal point detection. The difference between the image-capturing pixel 2A and the phase difference pixel 2B will be explained later.

The pixel 2 includes a photodiode serving as a photoelectric conversion element and multiple pixel transistors (so-called MOS transistors). The multiple pixel transistors include four MOS transistors, for example, a transfer transistor, a selection transistor, a reset transistor, and an amplification transistor.

The pixels 2 may have a shared pixel structure. This pixel-shared structure includes multiple photodiodes, multiple transfer transistors, a shared floating diffusion (floating diffusion area), and each of other shared pixel transistors. More specifically, in the shared pixels, the photodiodes and the transfer transistors having multiple unit pixels are configured to share each of other pixel transistors.

The control circuit 8 receives, for example, data commanding an operation mode and an input clock, and outputs data such as internal information about the solid-state image-capturing device 1. More specifically, the control circuit 8 generates a clock signal and a control signal serving as a reference of operation of, for example, the vertical drive circuit 4, the column signal processing circuit 5, and the horizontal drive circuit 6, on the basis of the vertical synchronization signal, the horizontal synchronization signal, and the master clock. Then, the control circuit 8 outputs the clock signal and the control signal thus generated to, for example, the vertical drive circuit 4, the column signal processing circuit 5, and the horizontal drive circuit 6.

The vertical drive circuit 4 includes, for example, shift registers, and selects a pixel drive wire 10, and provides a pulse for driving the pixels 2 to the selected pixel drive wire 10, thus driving the pixels 2 in units of rows. More specifically, the vertical drive circuit 4 selects and scans the pixels 2 of the pixel array unit 3 in units of rows in the vertical direction in order, and provides the pixel signal generated based on the signal electrical charge generated in accordance with the quantity of light reception by the photoelectric conversion unit of each pixel 2 to the column signal processing circuit 5 via a vertical signal line 9.

The column signal processing circuit 5 is provided for each column of the pixels 2, and performs signal processing such as noise reduction for each pixel column on the signals which are output from the pixels 2 for one row. For example, the column signal processing circuit 5 performs signal processing such as CDS (Correlated Double Sampling) and AD conversion for removing fixed pattern noises unique to the pixels.

The horizontal drive circuit 6 includes, for example, shift registers, and outputs horizontal scanning pulses in order, thereby selecting each of the column signal processing circuit 5 in order, and outputting the pixel signal from each of the column signal processing circuits 5 to a horizontal signal line 11.

The output circuit 7 performs signal processing on the signals provided in order via the horizontal signal line 11 from each of the column signal processing circuits 5 and outputs the signals. The output circuit 7 may, for example, only buffer the signals, or may perform various kinds of digital signal processing such as black level adjustment, column variation correction, and the like. An input/output terminal 13 exchanges signals to/from the outside.

The solid-state image-capturing device 1 configured as described above is a CMOS image sensor having a column AD method in which the column signal processing circuit 5 performing the CDS processing and the AD conversion processing are provided for each pixel column.

The solid-state image-capturing device 1 is a back-illuminated MOS solid-state image-capturing device which receives light from the back surface side opposite to the front surface side of the semiconductor substrate 12 on which the pixel transistors are formed.

<2. First Embodiment of Pixels>
<Cross Sectional Configuration View of Pixels>

Figure 2:
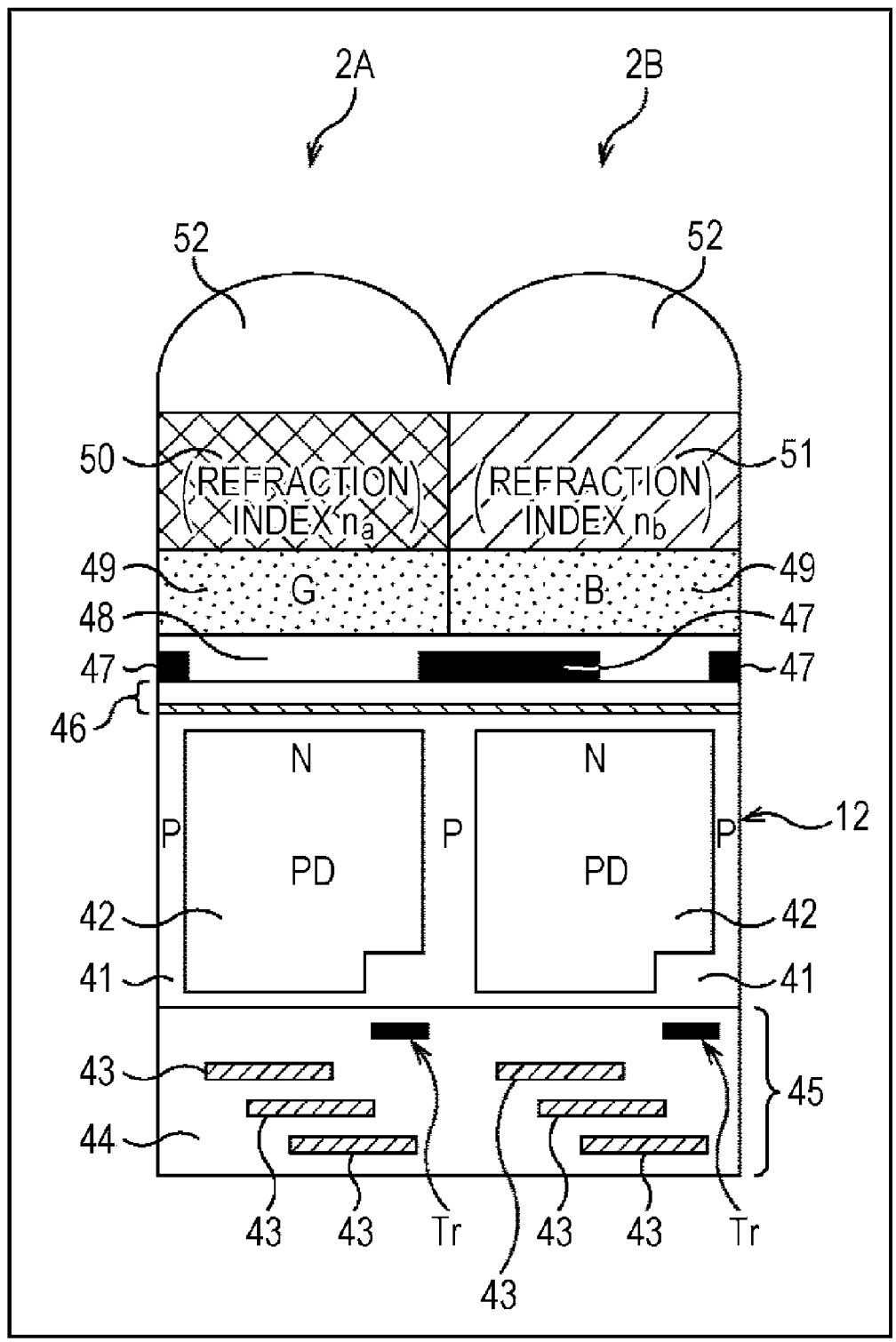
FIG. 2 is a cross sectional configuration diagram of pixels according to a first embodiment.

FIG. 2 is a cross sectional configuration diagram of pixels 2 according to the first embodiment. FIG. 2 illustrates a cross sectional configuration of an image-capturing pixel 2A and a phase difference pixel 2B which are adjacent to each other in the pixel array unit 3.

The structure of the image-capturing pixel 2A and the phase difference pixel 2B will be explained with reference to FIG. 2.

In the solid-state image-capturing device 1, for example, a semiconductor area 42 of an N-type (second conductivity-type) is formed in a semiconductor area 41 of a P-type (first conductivity-type) of the semiconductor substrate 12 for each pixel 2, so that the photodiode PD is formed in units of pixels. The P-type semiconductor area 41 facing both of the front and back surfaces of the semiconductor substrate 12 also serves as a positive hole electrical charge accumulation area for suppressing a dark current.

At the front surface side of the semiconductor substrate 12 (the lower side in the drawing), a multi-layer wire layer 45 is formed, which includes multiple pixel transistors Tr for, for example, reading electrical charge accumulated in the photodiode PD, multiple wire layers 43, and a layer insulating film 44.

At the interface of the back surface side of the semiconductor substrate 12 (the upper side in the drawing), a reflection preventing film (insulating layer) 46 is formed, which includes multiple layers of which refraction indexes are different such as two layer films including a hafnium oxide (HfO2) film and a silicon oxide film.

At a portion of the upper side of the reflection preventing film 46, a light shielding layer 47 is formed. More specifically, in the image-capturing pixel 2A, the light shielding layer 47 is formed only at the pixel borders on the reflection preventing film 46 so that the light is incident upon the entire surface of the photodiode PD. On the other hand, in the phase difference pixel 2B, the light shielding layer 47 is formed not only at the pixel borders but also on the half at one side of the light reception surface of the photodiode PD (the half portion at the left side in FIG. 2) so as to shield light.

The phase difference pixel 2B includes two types, for example, a type A in which the half portion at the left side of the light reception surface of the photodiode PD is open and type B in which the half portion at the right side of the light reception surface of the photodiode PD is open, and these two types make a pair and are arranged at a predetermined position of the pixel array unit 3. There is difference in the image between the pixel signal from the type A and the pixel signal from the type B due to the difference in the position where the aperture portion is formed. The amount of defocus is calculated by calculating the amount of phase difference from the deviation of the images, and the image-capturing lens is adjusted (moved), so that auto-focus can be achieved.

The light shielding layer 47 may be a material that shields light, but is desirably a material that has a high degree of light shielding property, and that can be processed accurately in fine processing technique such as etching. The light shielding layer 47 can be formed with a metal film such as tungsten (W), aluminum (Al), copper (Cu), titanium (Ti), molybdenum (Mo), and nickel (Ni).

On the reflection preventing film 46 including the light shielding layer 47, a planarization film 48. The planarization film 48 is formed through rotation/application of organic material such as resin. Alternatively, the planarization film 48 may also be formed by depositing an inorganic film such as SiO2 and planarizing the film by CMP (Chemical Mechanical Polishing).

On the planarization film 48, a color filter layer 49 is formed for each pixel. The color filter layer 49 is formed by rotating and applying photosensitive resin including coloring matter such as pigments and dyes. In the arrangement of the color filter layer 49, colors of R (red), G (green), and B (blue) are arranged in, for example, Bayer arrangement, but may be arranged in other arrangement method. In the example of FIG. 2, a G (green) color filter layer 49 is formed in the image-capturing pixel 2A at the left side, and a B (blue) color filter layer 49 is formed in the phase difference pixel 2B at the right side. It should be noted that the phase difference pixel 2B is not limited to the B color filter layer 49.

At the upper side of the color filter layer 49, layers are formed of which refraction indexes are different between the image-capturing pixel 2A and the phase difference pixel 2B.

More specifically, at the upper side of the color filter layer 49 of the image-capturing pixel 2A, a high refraction index layer 50 having a refraction index $n_a$ is formed. At the upper side of the color filter layer 49 of the phase difference pixel 2B, a low refraction index layer 51 having a refraction index $n_b$ is formed. In this case, the difference of the refraction index between the high refraction index layer 50 and the refraction index of the low refraction index layer 51 is equal to or more than 0.2

$$(n_a - n_a \geq 0.2).$$

The high refraction index layer 50 and the low refraction index layer 51 are formed to have the same thickness, that is, about 1 μm so that the phase difference pixel 2B can have a thickness to be able to have a sufficient level of phase difference detection accuracy.

The high refraction index layer 50 is formed with an inorganic film such as nitride film (SiN), oxynitride (SiON), silicon carbide (SiC), and the like. On the other hand, the low refraction index layer 51 is formed with an oxide film (SiO2), and a resin material such as styrene resin, acrylic resin, styrene-acrylic copolymerization resin, or siloxane resin.

Above the color filter layer 49, a micro lens (on-chip lens) 52 is formed for each pixel. The micro lens 52 is made of a material having almost the same refraction index as that of the low refraction index layer 51. The micro lens 52 is formed with a resin material such as styrene resin, acrylic resin, styrene-acrylic copolymerization resin, or siloxane resin.

The image-capturing pixel 2A and the phase difference pixel 2B of the pixel array unit 3 of the solid-state image-capturing device 1 are configured as described above.

<Diagonal Incidence Characteristic of Pixels>

Figure 3:
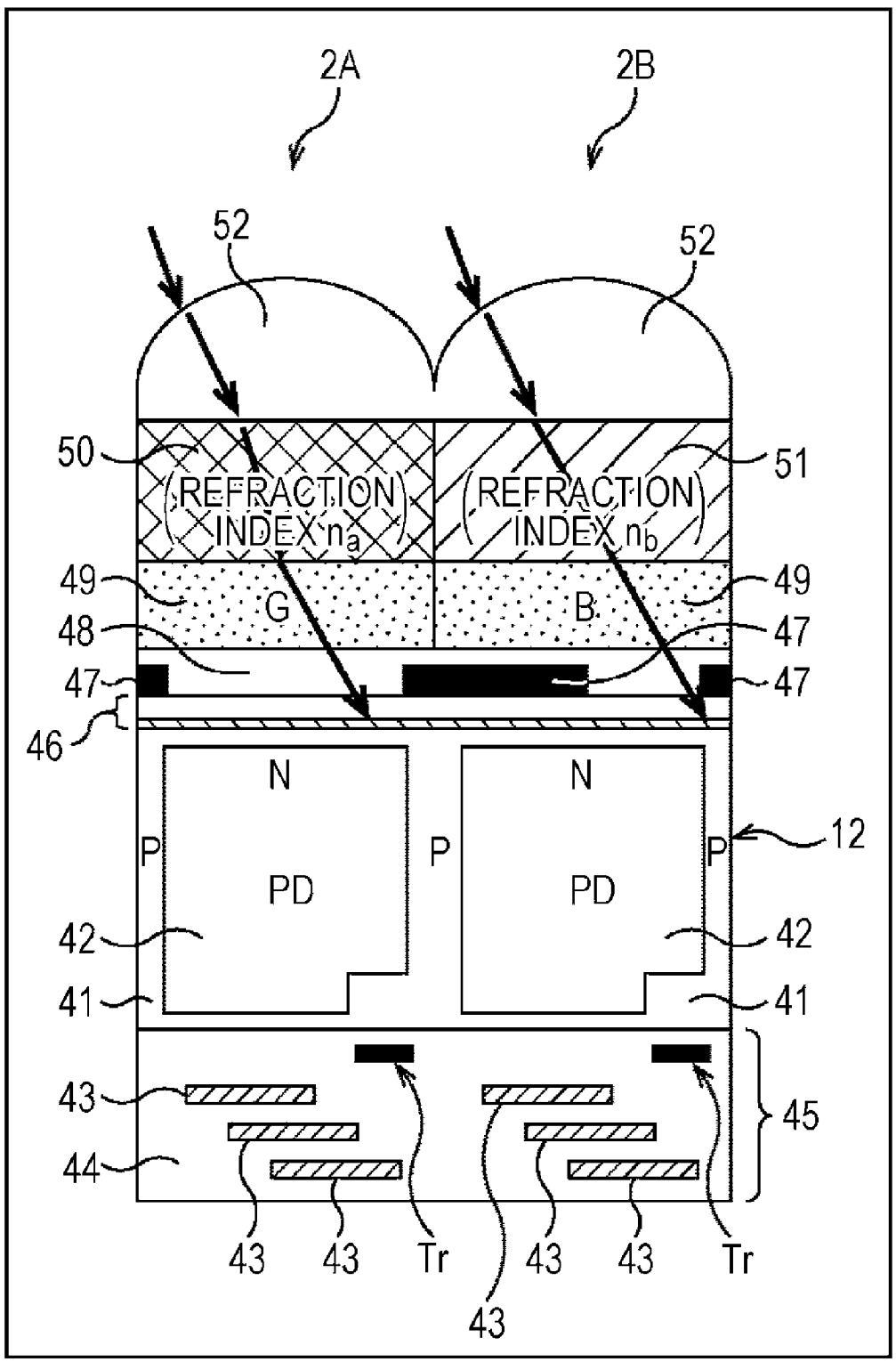
FIG. 3 is a figure for explaining diagonal incidence characteristic of a pixel structure of the first embodiment.

FIG. 3 is a figure illustrating the state of propagation of diagonal incidence light in order to explain diagonal incidence characteristic of the pixel structure according to the first embodiment.

The structure of a generally-available back-illuminated-type solid-state image-capturing device corresponds to a structure obtained by removing the high refraction index layer 50 and the low refraction index layer 51 from the structure of the first embodiment shown in FIG. 2. In this case, the distance from the micro lens 52 to the light shielding layer 47 is short, and therefore, the sensitivities are not sufficiently dependent on the angle, and the phase difference detection accuracy is low.

In the structure according to the present embodiment, the low refraction index layer 51 is formed on the color filter layer 49 for the phase difference pixel 2B, so that the sensitivity is highly dependent on the angle. More specifically, the low refraction index layer 51 is made as the thick film so that diagonal incidence light other than a desired angle is out of the aperture portion of the light shielding layer 47, and this increases the change of output with respect to the amount of defocus, and accordingly the phase difference detection accuracy is improved.

In contrast, for the image-capturing pixel 2A, the low refraction index layer 51 is not formed. Instead, the high refraction index layer 50 of which refraction index is different from the low refraction index layer 51 by 0.2 or more is formed on the color filter layer 49. Therefore, the image-capturing pixel 2A has the same device height as the phase difference pixel 2B, but due to the refraction effect of the high refraction index layer 50, the dependency on the angel can be reduced. Therefore, according to the solid-state image-capturing device 1 employing the pixel structure of the first embodiment, while a high degree of phase difference detection accuracy is realized in the phase difference pixel 2B, the degradation of the characteristic of the image-capturing pixel 2A can be reduced to a minimum.

<Production Method of Pixels According to First Embodiment>

Subsequently, a production method of pixels 2 according to the first embodiment explained above will be explained with reference to FIGS. 4A to 4F.

It should be noted that the production steps of the pixel 2 according to the first embodiment until the color filter layer 49 is formed on the planarization film 48 are the same as a conventional production method of a back-illuminated-type solid-state image-capturing device, and in FIGS. 4A to 4F, the semiconductor substrate 12 on which the photodiode PD is formed and the multi-layer wire layer 45 on the front surface side thereof are simplified or omitted from the drawing.

Figure 4:
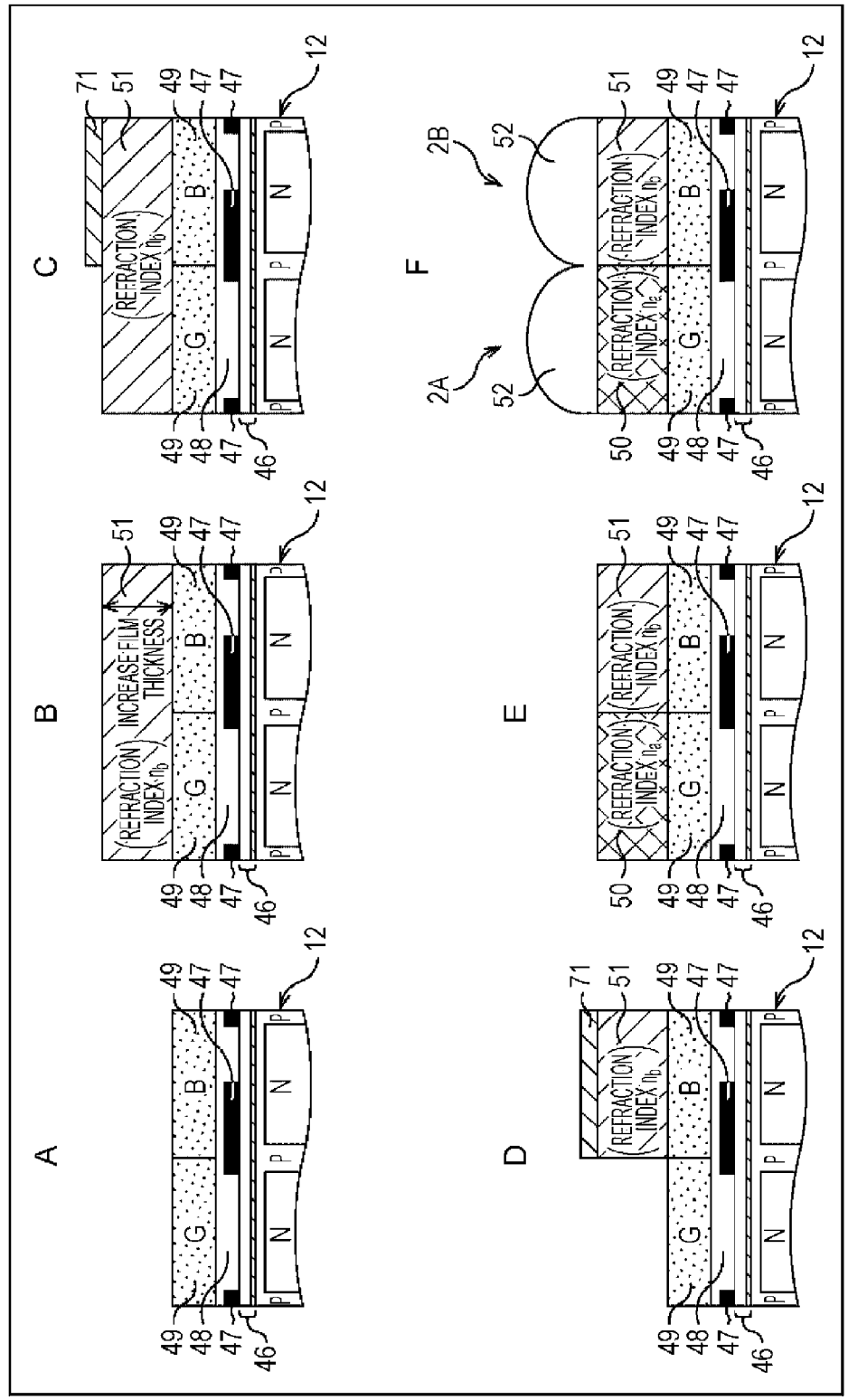
FIGS. 4A to 4F are figures for explaining a production method of pixels according to the first embodiment.

First, as shown in FIG. 4A, a reflection preventing film 46, a light shielding layer 47, a planarization film 48, and a color filter layer 49 are formed in order on the back surface side of the semiconductor substrate 12. The production method up to this point is the same as the conventional production method of the back-illuminated-type solid-state image-capturing device.

Subsequently, as shown in FIG. 4B, the low refraction index layer 51 is formed to be thicker (deposited) on the color filter layer 49 by, for example, increasing the deposition time of the CVD method.

Subsequently, as shown in FIG. 4C, a resist 71 is patterned and etched only in the area of the phase difference pixel 2B of the pixel array unit 3, so that, as shown in FIG.

4D, the low refraction index layer 51 in the area of the image-capturing pixel 2A is removed.

Then, as shown in FIG. 4E, the high refraction index layer 50 is formed to be thicker (deposited) in the area of the image-capturing pixel 2A, where the low refraction index layer 51 is removed, by, for example, the CVD method.

Finally, as shown in FIG. 4F, the micro lens 52 is formed with a resin material having almost the same refraction index as that of the low refraction index layer 51. The micro lens 52 can be formed by performing pattern processing on a photosensitive resin material by, for example, lithography technique and thereafter changing it into a lens shape by reflow processing.

3. Second Embodiment of Pixels>
<Cross Sectional Configuration View of Pixels>

Figure 5:
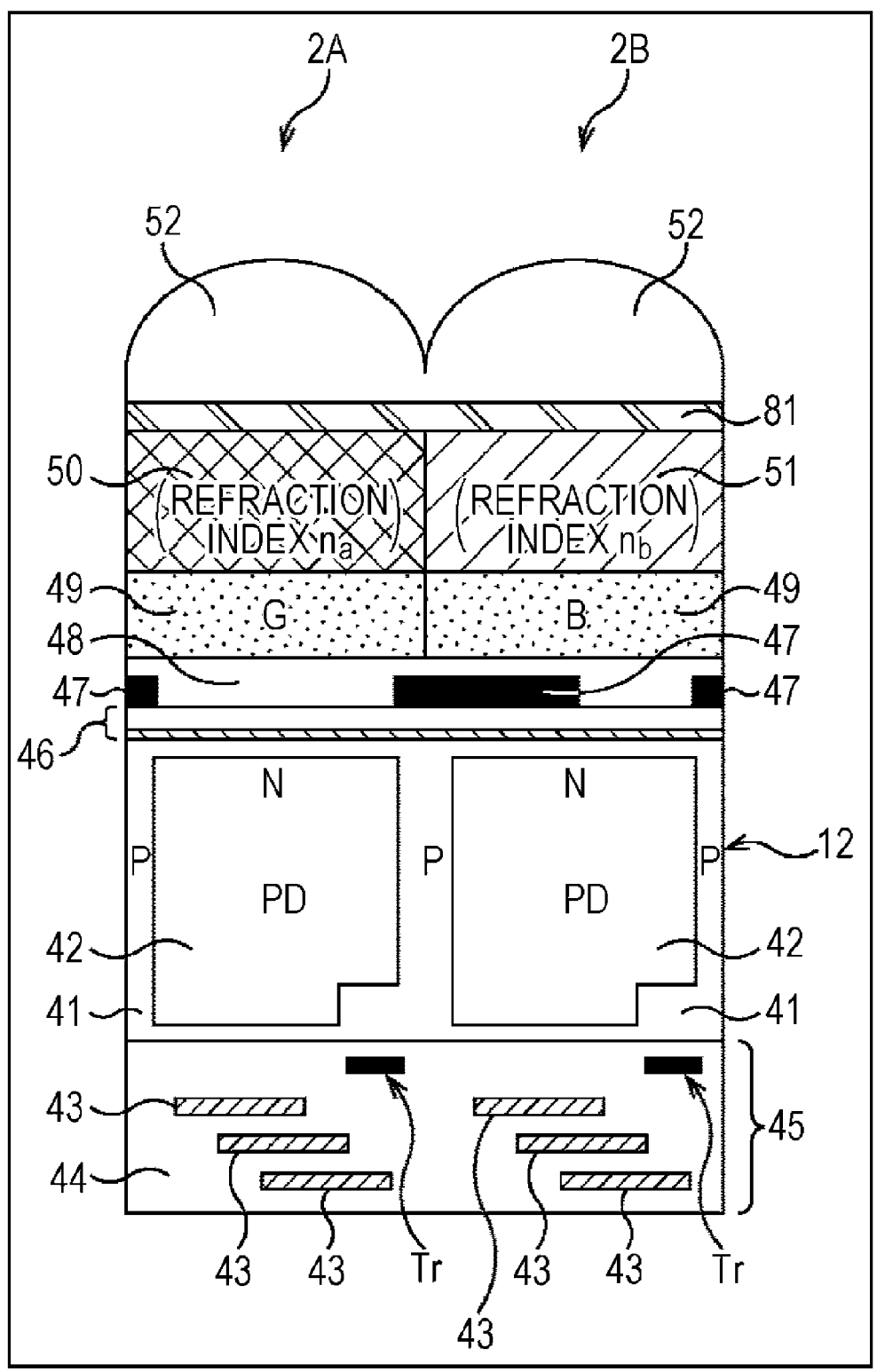
FIG. 5 is a cross sectional configuration diagram of pixels according to a second embodiment.

FIG. 5 is a cross sectional configuration diagram according to the second embodiment of pixels 2. In FIG. 5, the portions corresponding to the first embodiment as shown in FIG. 2 are also denoted with the same reference numerals, and explanation about these portions are omitted as necessary.

The second embodiment in FIG. 5 is different from the first embodiment in FIG. 2 in that a planarization film 81 is formed between the high refraction index layer 50 and the low refraction index layer 51 and the micro lens 52.

The planarization film 81 is formed with, for example, acrylic resin. The planarization film 81 is formed by, for example, depositing an inorganic film such as SiO2 and planarizing the film by CMP. The film thickness of the planarization film 81 may be, for example, about 300 nm.

The planarization film 81 may be made of the same material as that of the low refraction index layer 51 or may be made of a material different from that of the low refraction index layer 51, as long as it has about the same refraction index as that of the low refraction index layer 51. Therefore, in the second embodiment, a layer of which refraction index is less than that of the high refraction index layer 50 is formed between the high refraction index layer 50 and the low refraction index layer 51 and the micro lens 52.

In the second embodiment, the difference in the refraction index between the low refraction index layer 51 and the high refraction index layer 50 is configured to be equal to or more than 0.2. Therefore, in the image-capturing pixel 2A, the angle dependency is reduced due to the effect of refraction by the high refraction index layer 50, and in the phase difference pixel 2B, the angle dependency is enhanced by the low refraction index layer 51. Therefore, in the solid-state image-capturing device 1 that employs the pixel structure according to the second embodiment, while a high degree of phase difference detection accuracy is realized in the phase difference pixel 2B, the degradation of the characteristic of the image-capturing pixel 2A can be reduced to a minimum.

The production method of pixels 2 according to the second embodiment will be explained with reference to FIGS. 4A to 4F.

As shown in FIG. 4E, the pixel 2 according to the second embodiment is formed as follows: the high refraction index layer 50 and the low refraction index layer 51 are formed on the color filter layer 49 and thereafter the planarization film 81 is formed. The planarization film 81 can be formed by applying, for example, acrylic resin material by a spin coat method and carrying out thermosetting treatment. Thereafter, the micro lens 52 is formed by resin material having almost the same refraction index as that of the low refraction index layer 51.

<4. Third Embodiment of Pixels>
<Cross Sectional Configuration View of Pixels>

Figure 6:
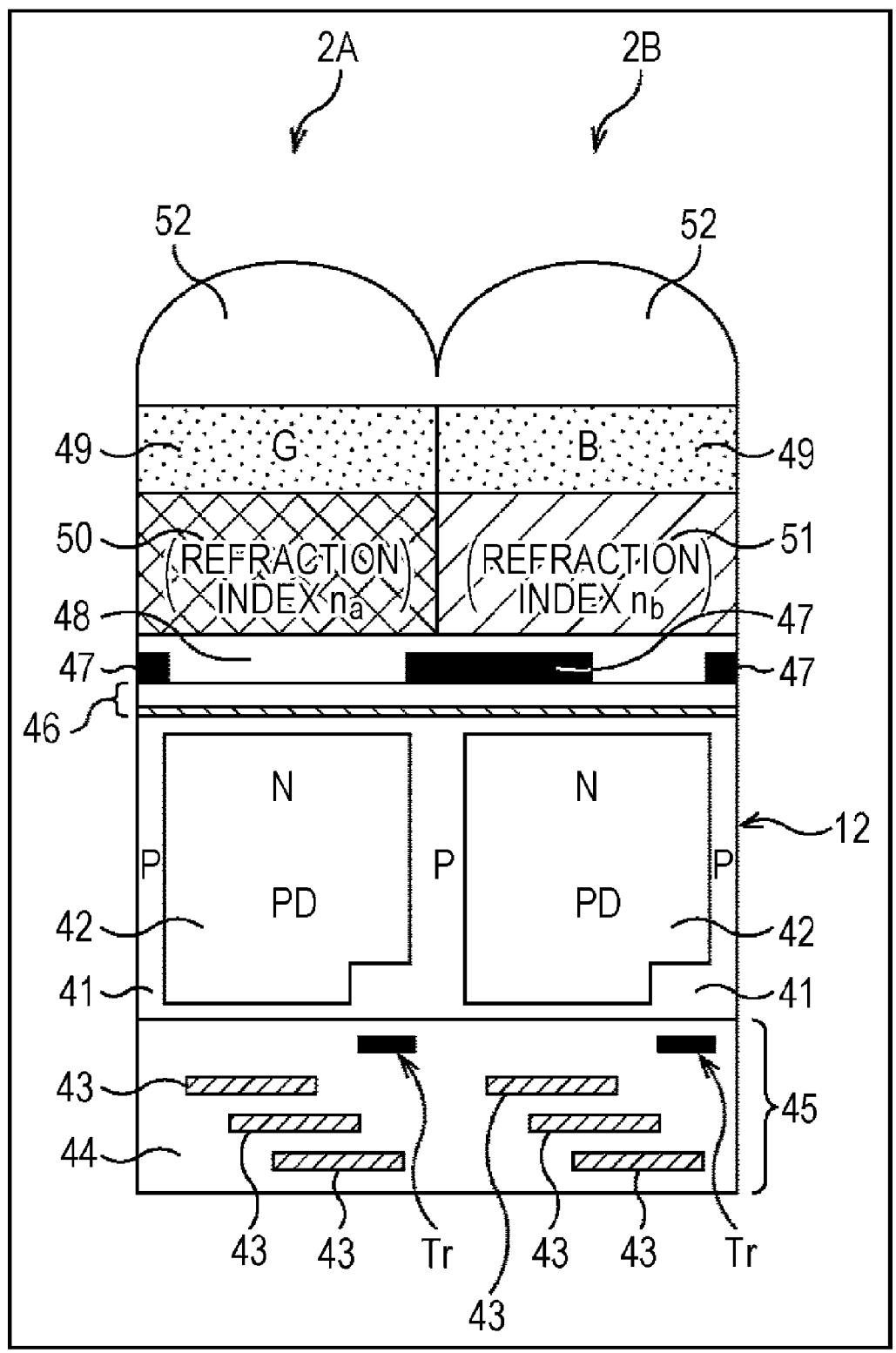
FIG. 6 is a cross sectional configuration diagram of pixels according to a third embodiment.

FIG. 6 is a cross sectional configuration diagram according to the third embodiment of pixels 2. In FIG. 6, the portions corresponding to the first embodiment as shown in FIG. 2 are denoted with the same reference numerals, and explanation about these portions are omitted as necessary.

The third embodiment of FIG. 6 is different from the first embodiment of FIG. 2 in that the layer of the high refraction index layer 50 and the low refraction index layer 51 and the color filter layer 49 are opposite to those of the first embodiment as shown in FIG. 2.

More specifically, in the third embodiment, the high refraction index layer 50 is formed in the area of the image-capturing pixel 2A at the upper side of the planarization film 48, and the low refraction index layer 51 is formed in the area of the phase difference pixel 2B at the upper side of the planarization film 48. Then, the color filter layer 49 is formed at the upper side of, the high refraction index layer 50 and the low refraction index layer 51.

In the third embodiment, the difference in the refraction index between the low refraction index layer 51 and the high refraction index layer 50 is configured to be equal to or more than 0.2. Therefore, in the image-capturing pixel 2A, the angle dependency is reduced due to the effect of refraction by the high refraction index layer 50, and in the phase difference pixel 2B, the angle dependency is enhanced by the low refraction index layer 51. Therefore, in the solid-state image-capturing device 1 that employs the pixel structure according to the third embodiment, while a high degree of phase difference detection accuracy is realized in the phase difference pixel 2B, the degradation of the characteristic of the image-capturing pixel 2A can be reduced to a minimum.

<Production Method of Pixels According to Third Embodiment>

A production method of pixels 2 according to the third embodiment explained above will be explained with reference to FIGS. 7A to 7F.

FIGS. 7A to 7F are the same as FIGS. 4A to 4F in that the semiconductor substrate 12 and the multi-layer wire layer 45 on the front surface side thereof are simplified or omitted from the drawing.

Figure 7:
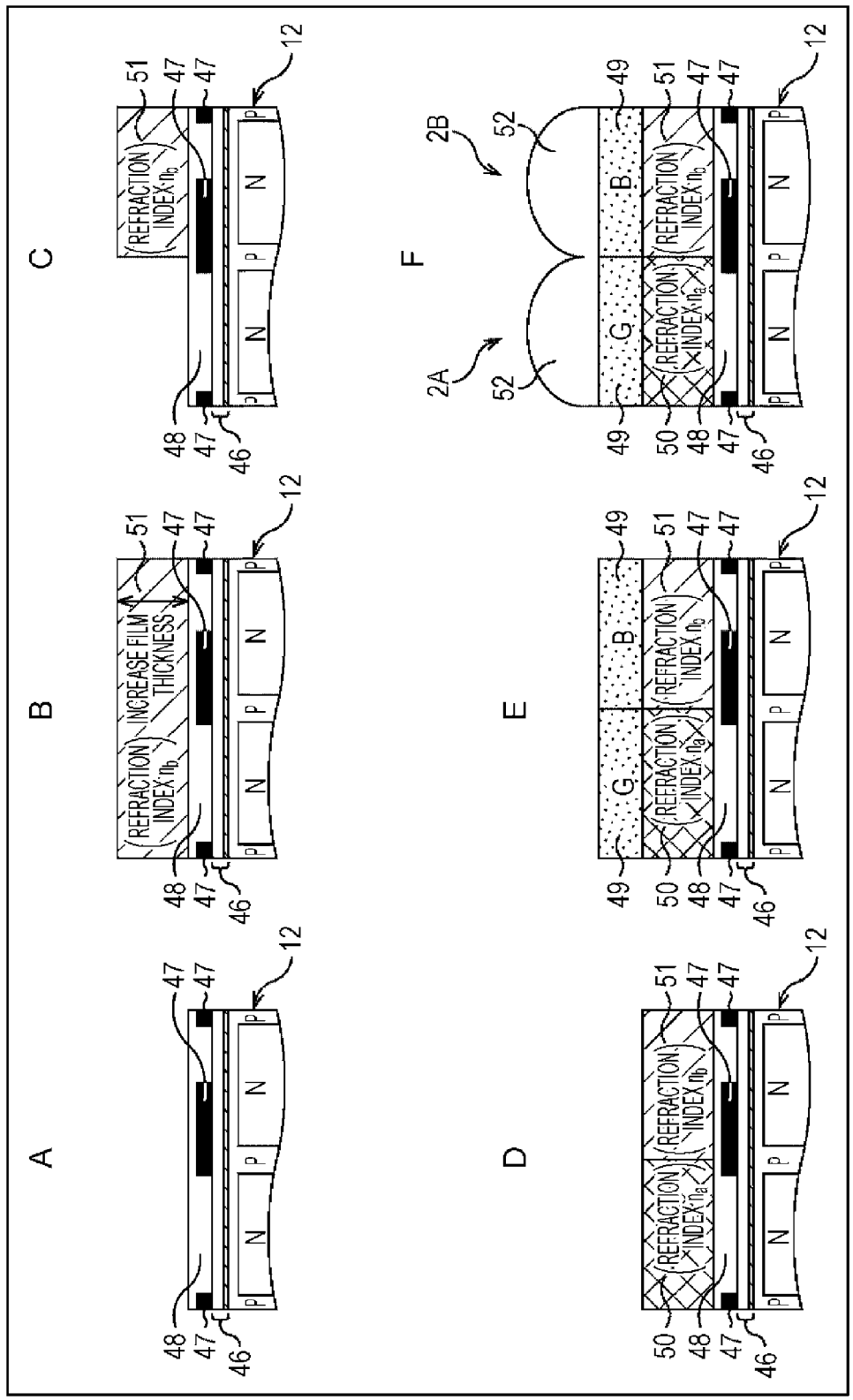
FIGS. 7A to 7F are figures for explaining a production method of pixels according to the third embodiment.

First as shown in FIG. 7A, a reflection preventing film 46, a light shielding layer 47, and a planarization film 48 are formed in order on the back surface side of the semiconductor substrate 12. The production method up to this point is the same as the conventional production method of the back-illuminated-type solid-state image-capturing device.

Subsequently, the low refraction index layer 51 is formed to be thicker (deposited) on the planarization film 48 by, for example, the CVD method. It should be noted that the planarization film 48 and the low refraction index layer 51 can be formed with the same material, and in such case, the planarization film 48 and the low refraction index layer 51 can be formed in the same process until the total film thickness of the planarization film 48 and the low refraction index layer 51 is attained.

Subsequently, as shown in FIG. 7C, a resist 71 is patterned and etched just like FIG. 4D explained above, the low refraction index layer 51 in the area of the image-capturing pixel 2A is removed.

Then, as shown in FIG. 7D, the high refraction index layer 50 is formed to be thicker (deposited) in the area of the image-capturing pixel 2A, where the low refraction index layer 51 is removed by, for example, the CVD method.

Subsequently, as shown in FIG. 7E, at the upper side of the high refraction index layer 50 and the low refraction index layer 51, the color filter layer 49 is formed by applying photosensitive resin including coloring matter such as pigments and dyes and performing pattern processing.

Finally, as shown in FIG. 7F, the micro lens 52 is formed with a resin material having almost the same refraction index as that of the low refraction index layer 51.

<5. Fourth Embodiment of Pixels>
<Cross Sectional Configuration View of Pixels>

Figure 8:
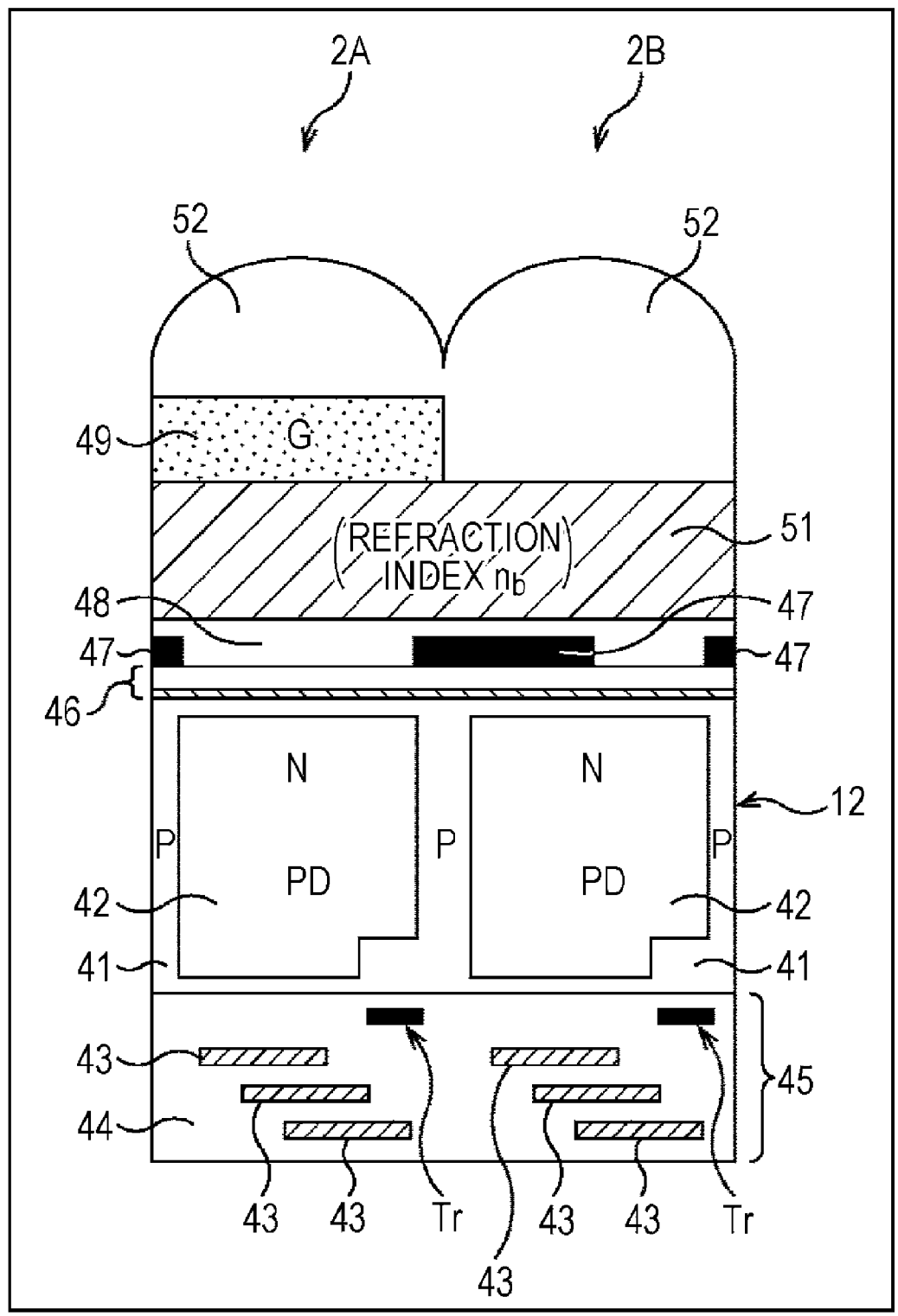
FIG. 8 is a cross sectional configuration diagram of pixels according to a fourth embodiment.

FIG. 8 is a cross sectional configuration diagram according to the fourth embodiment of pixels 2. In FIG. 8, the portions corresponding to the first embodiment as shown in FIG. 2 are also denoted with the same reference numerals, and explanation about these portions are omitted as necessary.

In the fourth embodiment of FIG. 8, the low refraction index layer 51 is formed at the upper side the planarization film 48 of the image-capturing pixel 2A and the phase difference pixel 2B to have such thickness that a sufficient level of phase difference detection accuracy can be obtained. The low refraction index layer 51 may be made of the same material as that of the planarization film 48 below the low refraction index layer 51 or may be made of a material different from that of the low refraction index layer 51.

The color filter layer 49 is formed in the area of the image-capturing pixel 2A at the upper side of the low refraction index layer 51. The color filter layer 49 is made of photosensitive resin including coloring matter such as pigments and has almost the same refraction index as that of the high refraction index layer 50.

On the other hand, the material of the micro lens 52 is embedded in the area of the phase difference pixel 2B which is the same layer as the high refraction index layer 50, and is integrally formed with the micro lens 52 formed at the uppermost portion of each pixel 2.

In the fourth embodiment, the color filter layer 49 has a high refraction index ($n_a$) which is almost the same as that of the high refraction index layer 50, and the micro lens 52 has a low refraction index ($n_b$) which is almost the same as that of the low refraction index layer 51, and therefore, the color filter layer 49 of the image-capturing pixel 2A and the material layer of the micro lens 52 having the same thickness are configured such that the difference in the refraction index is equal to or more than 0.2. Therefore, in the image-capturing pixel 2A, the dependency upon the angle is reduced due to the refraction effect of the color filter layer 49, and in the phase difference pixel 2B, the dependency on the angel is enhanced by the material layer of the micro lens 52. Therefore, in the solid-state image-capturing device 1 that employs the pixel structure according to the fourth embodiment, while a high degree of phase difference detection accuracy is realized in the phase difference pixel 2B, the degradation of the characteristic of the image-capturing pixel 2A can be reduced to the minimum.

In the fourth embodiment, a sufficient level of dependency upon the angle can be obtained with a smaller amount of increase in the film thickness as compared with the case where the color filter layer 49 having the high refraction index is formed in the phase difference pixel 2B, and therefore, the degradation of the characteristic of the image-capturing pixel 2A can be suppressed. In addition, in the phase difference pixel 2B, there is no absorption by the color filter layer 49, and therefore the sensitivity increases. Therefore, in the phase difference pixel 2B, a high degree of phase difference detection accuracy can be obtained.

<Production Method of Pixels According to Fourth Embodiment>

A production method of pixels 2 according to the fourth embodiment explained above will be explained with reference to FIGS. 9A to 9E.

FIGS. 9A to 9E are the same as FIGS. 4A to 4F in that the semiconductor substrate 12 and the multi-layer wire layer 45 on the front surface side thereof are simplified or omitted from the drawing.

Figure 9:
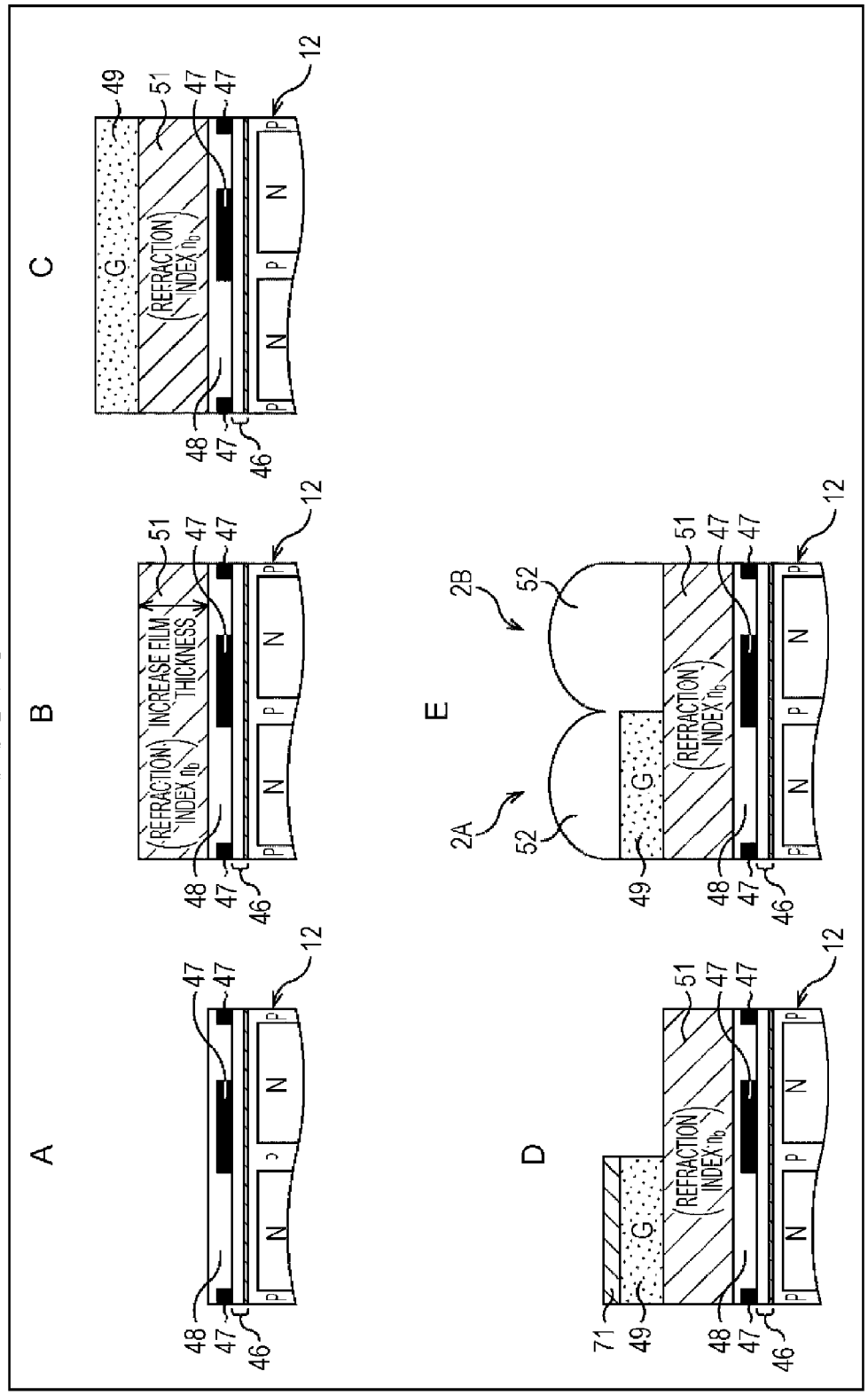
FIGS. 9A to 9E are figures for explaining a production method of pixels according to the fourth embodiment.

First, as shown in FIG. 9A, a reflection preventing film 46, a light shielding layer 47, and a planarization film 48 are formed in order on the back surface side of the semiconductor substrate 12. The production method up to this point is the same as the conventional production method of the back-illuminated-type solid-state image-capturing device.

Subsequently, as shown in FIG. 9B, the low refraction index layer 51 is formed to be thicker (deposited) on the planarization film 48 by, for example, the CVD method, until such a thickness is obtained such that a sufficient level of phase difference detection accuracy can be obtained.

Subsequently, as shown in FIG. 9C, the color filter layer 49 can be formed by applying, for example, photosensitive resin including coloring matter such as pigments and dyes to the entire surface of the planarization film 48 by a coating method such as a spin coat method and carrying out thermosetting treatment.

Then, as shown in FIG. 9D, the resist 71 is patterned and etched only in the area of the image-capturing pixel 2A, so that the color filter layer 49 in the area of the phase difference pixel 2B is removed.

Then, after the resist 71 is removed, the material of the micro lens 52 is embedded as shown in FIG. 9E, and is integrally formed with the micro lens 52 formed at the uppermost portion of each pixel 2.

<6. Fifth Embodiment of Pixels>
<Cross Sectional Configuration View of Pixels>

Figure 10:
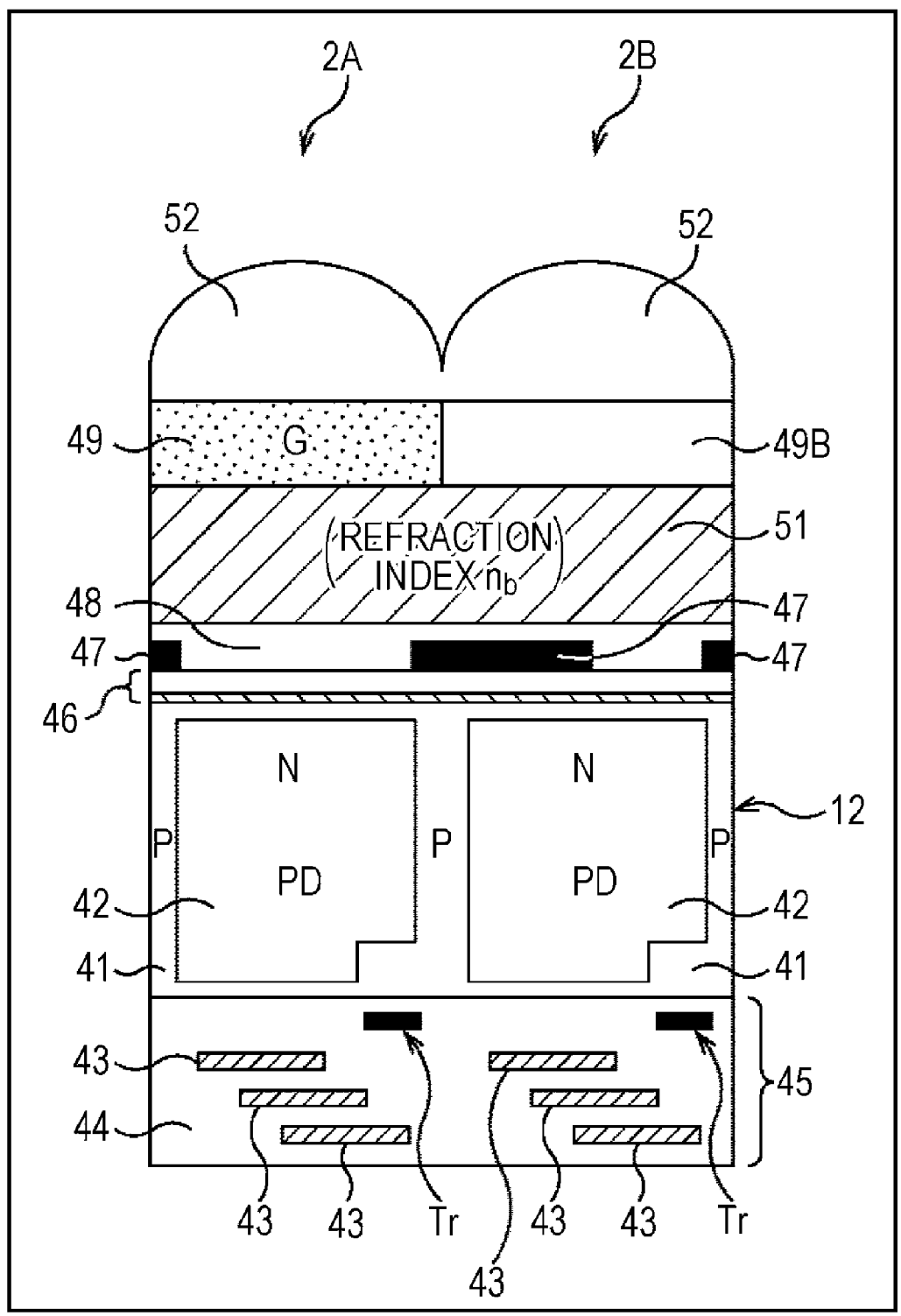
FIG. 10 is a cross sectional configuration diagram of pixels according to a fifth embodiment.

FIG. 10 is a cross sectional configuration diagram according to the fifth embodiment of pixels 2.

In the fourth embodiment as shown in FIG. 8, the material of the micro lens 52 is embedded in the corresponding portion of the phase difference pixel 2B which is a counterpart of the color filter layer 49 formed in the image-capturing pixel 2A. In the fifth embodiment, as shown in FIG. 10, a transparent (white) color filter layer 49B using a material of which refraction index is about the same as that of the low refraction index layer 51 (that is, $n_b$) is formed in the corresponding portion of the phase difference pixel 2B. It should be noted that the low refraction index layer 51 itself may be embedded into the corresponding portion of the phase difference pixel 2B.

<7. Aperture Shape of Light Shielding Layer>

Subsequently, the aperture shape of the light shielding layer 47 of the phase difference pixel 2B of the solid-state image-capturing device 1 will be explained.

Figure 11:
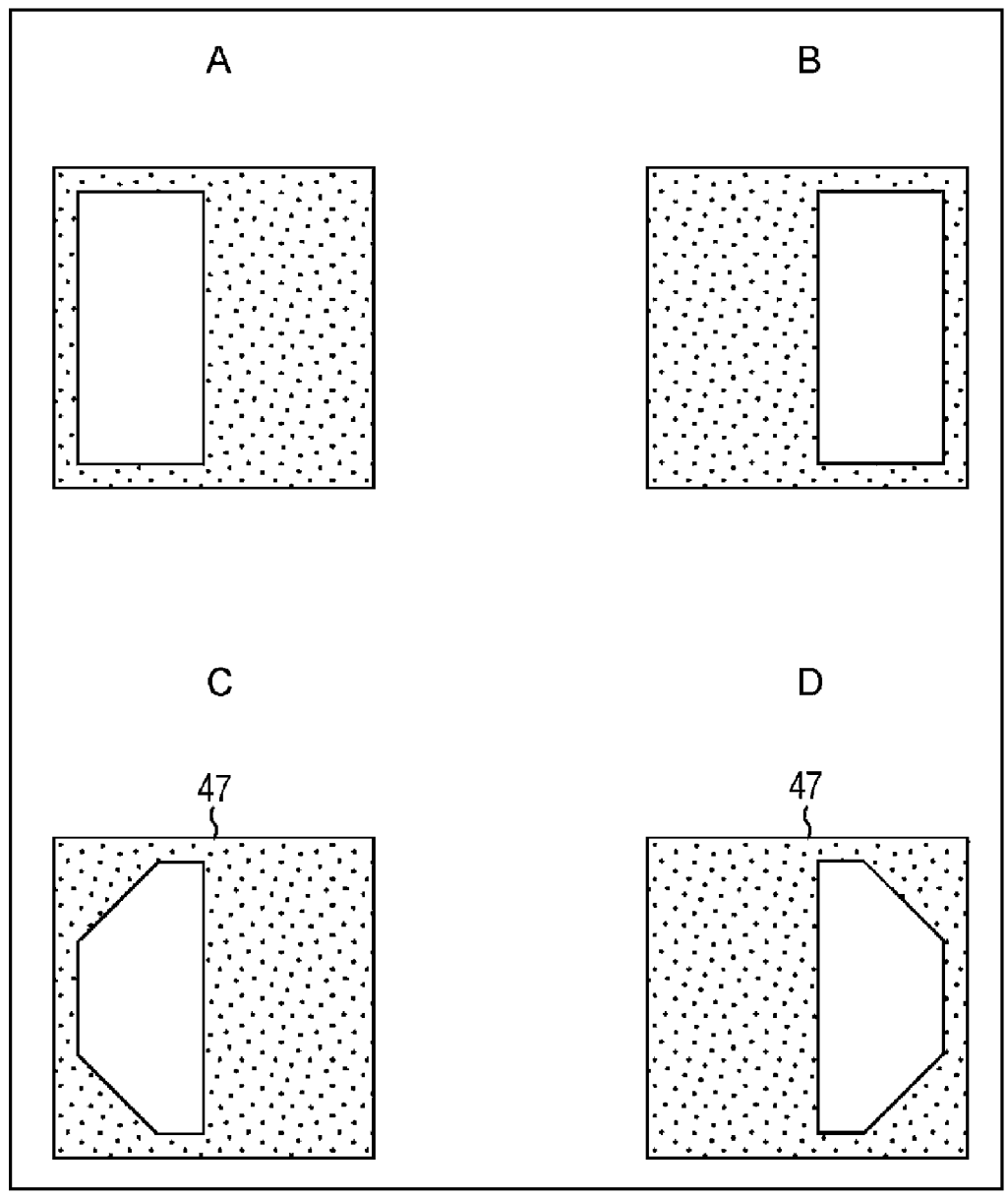
FIGS. 11A to 11D are top views illustrating light shielding layers for a phase difference pixel.

FIGS. 11A and 11B are top views illustrating a conventional light shielding layer. FIGS. 11C and 11D are top views illustrating the light shielding layer 47 of the phase difference pixel 2B.

As shown in FIGS. 11A and 11B, the aperture shapes of a conventional light shielding layer are rectangular shapes for pupil-splitting the light reception surface of the photodiode PD into the half portion at the left side and the half portion at the right side.

In contrast, the aperture shapes of the light shielding layer 47 of the phase difference pixel 2B of the solid-state image-capturing device 1 are based on the conventional aperture shapes for pupil-splitting into the half portion at the left side and the half portion at the right side, but is further configured such that the areas in proximity to the four corners of the rectangular pixel area are configured into a hexagonal shape for shielding light as shown in FIGS. 11C and 11D. As described above, when the areas in proximity to the four corners of the rectangular pixel area are made into a narrower polygonal shape, unnecessary light that is incident from the flat portion (gap portion) of the micro lens 52 in proximity to the four corners of the pixel area can be shielded.

Figure 12:
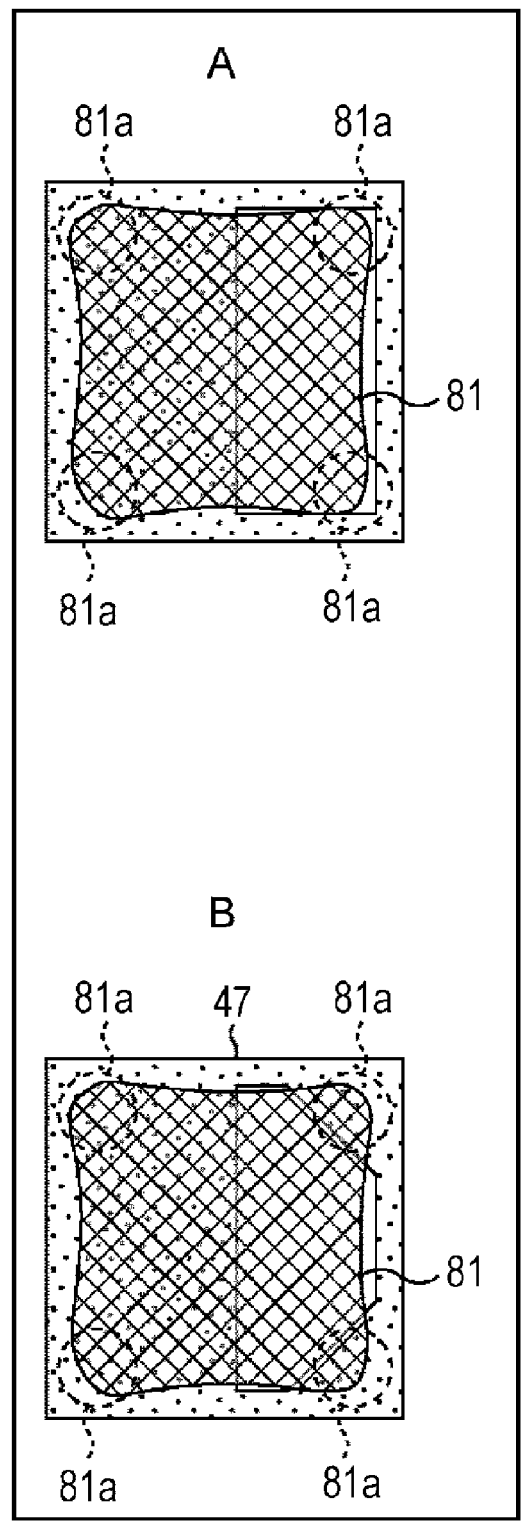
FIGS. 12A and 12B are figures for explaining aperture shapes of light shielding layers for a phase difference pixel.

FIGS. 12A and 12B are figures illustrating a light shielding layer for pupil-splitting the half portion at the right side and the light shielding layer 47 of the phase difference pixel 2B overlaid with a light passage area 81.

In the light passage area 81 as shown in FIGS. 12A and 12B, areas 81a in proximity to the four corners of the pixel area enclosed by broken lines are areas of unnecessary light incident from the flat portion (gap portion) of the micro lens 52 in proximity to the four corners of the rectangular pixel area.

As shown in FIG. 12B, the light shielding layer 47 is in the hexagonal shape in which the areas in proximity to the four corners of the pixel area are narrowed, and therefore, the phase difference pixel 2B can shield unnecessary light in the areas 81a. Therefore, the S/N ratio of the pixel signal is improved, and the angle dependency of the phase difference pixel 2B can be improved, and therefore, a high degree of phase difference detection accuracy can be realized. For example, the aperture shape of the light shielding layer 47 of the phase difference pixel is a shape in which areas in proximity to the four corners of a rectangular pixel area are narrowed, such as in the shape of an irregular hexagon.

<Effects of Pixel Structure According to an Embodiment of the Present Disclosure>

The effects of the pixel structure according to an embodiment of the present disclosure will be explained with reference to FIG. 13.

Figure 13:
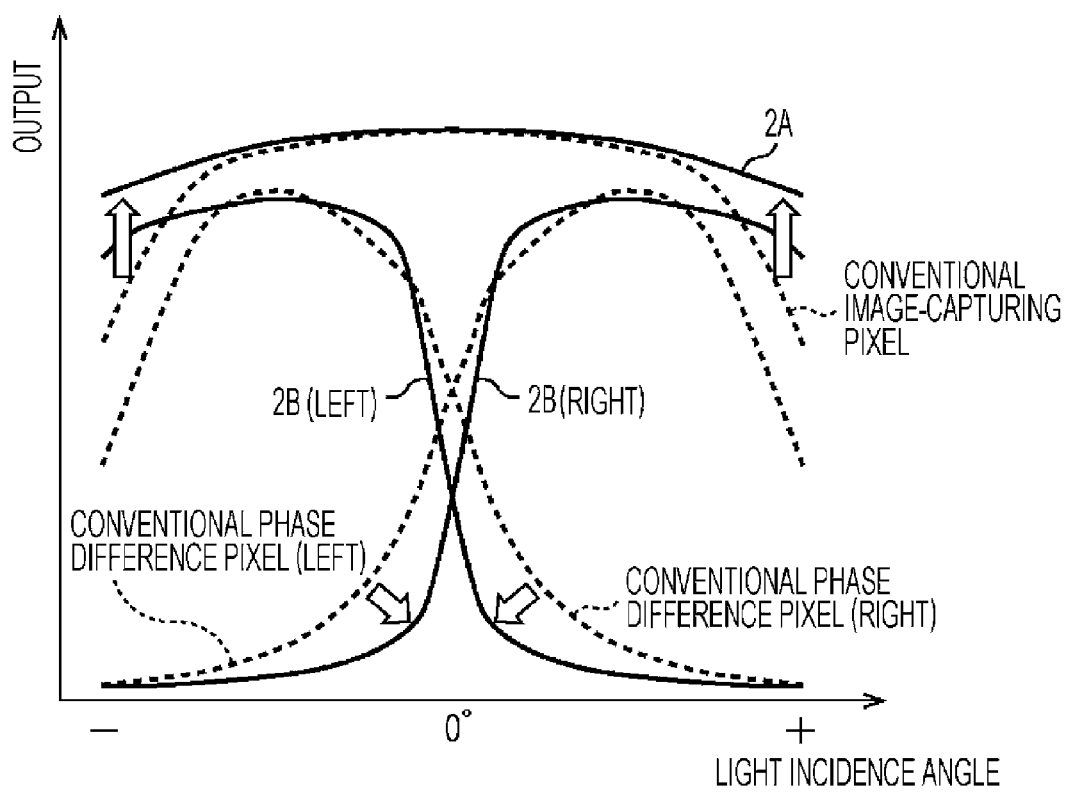
FIG. 13 is a figure for explaining an effect of a pixel structure according to an embodiment of the present disclosure.

FIG. 13 is a figure illustrating incidence angle dependency characteristic illustrating relationship between the incidence angle and the signal output when the light is incident thereupon, and illustrating a comparison between the pixel structure of the present disclosure and a conventional pixel structure.

In this case, the conventional pixel structure means a structure in which the low refraction index layer has a thicker film thickness in each pixel including the image-capturing pixel, and the aperture shape of the light shielding layer is a rectangular shape as shown in FIGS. 11A and 11B in order to enhance the phase difference detection accuracy in the phase difference pixel for the conventional back-illuminated-type pixel structure. In other words, the conventional pixel structure is a structure in which no high refraction index layer 50 is provided, and only the low refraction index layer 51 is thicker on all of the pixels, and the aperture shape of the light shielding layer is a rectangular shape as shown in FIGS. 11A and 11B.

In FIG. 13, the incidence angle dependency characteristics of the solid lines indicate the incidence angle dependency characteristics of the image-capturing pixel 2A and the phase difference pixel 2B, and the incidence angle dependency characteristics of the broken lines indicate the incidence angle dependency characteristics of the image-capturing pixel and the phase difference pixel of the conventional structure. The phase difference pixels 2B includes two types shown therein, which include the phase difference pixel 2B (right) that passes light through the half portion at the right side of FIG. 11D and the phase difference pixel 2B (left) that passes light through the half portion at the left side of FIG. 11C. The conventional phase difference pixels also include such two types.

According to the incidence angle dependency characteristics as shown in FIG. 13, the image-capturing pixel 2A is provided with the high refraction index layer 50, and therefore, as compared with the conventional pixel structure, the signal output at the diagonal incidence angle is increased, and the degradation of the diagonal incidence characteristic is reduced to a low level.

In the phase difference pixel 2B, the sensitivity is more greatly dependent on the angle as compared with the conventional case, due to the increased film thickness of the low refraction index layer 51 and the light shielding layer 47 in the hexagonal shape for shielding unnecessary light incident from the flat portion (gap portion) of the micro lens 52. More specifically, as compared with the conventional pixel structure, the output greatly changes in response to small change of the incidence angel at around an incidence angle of zero degrees where the output of the phase difference pixel 2B (right) and the output of the phase difference pixel 2B (left) are switched.

Therefore, according to the pixel structure of the present disclosure, while a high degree of phase difference detection accuracy is realized in the phase difference pixel 2B, the degradation of the characteristic of the image-capturing pixel 2A can be reduced to the minimum.

<8. Modification of Aperture Width of Light Shielding Layer>

In each of the embodiments explained above, an example has been explained, in which, the aperture portion of the light shielding layer 47 of the phase difference pixel 2B is pupil-split into the half portion at the right side and the half portion at the left side with the border at the center of the optical axis (light reception area), a so-called image height of zero percent, as shown in FIGS. 11C and 11D.

Figure 14:
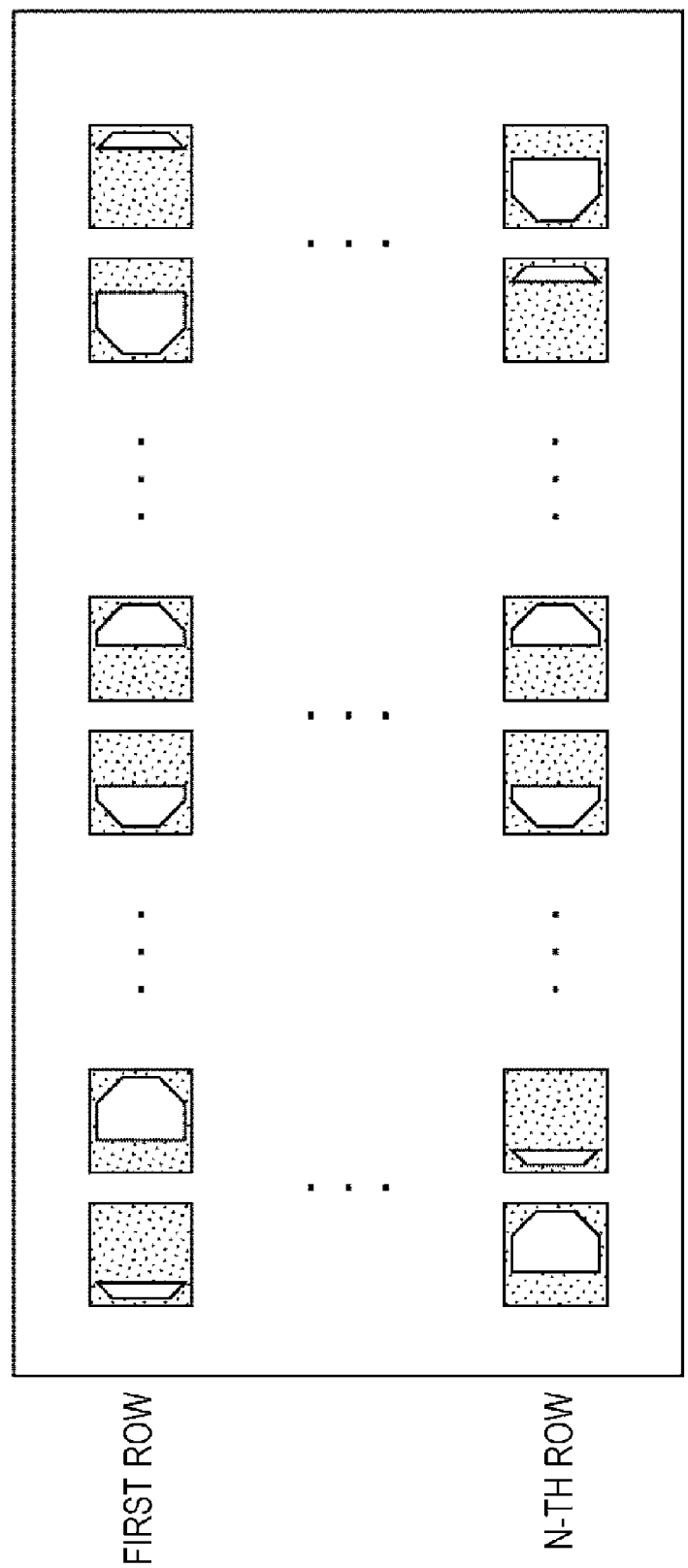
FIG. 14 is a figure illustrating modifications of aperture widths of phase difference pixels.

However, as shown in FIG. 14, a pair of phase difference pixels 2B having light shielding layers 47 of aperture portions which is pupil-split at the image height at the plus side (+ side) and a pair of phase difference pixels 2B having light shielding layers 47 of aperture portions which is pupil-split at the image height at the minus side (− side) may be arranged at any given position of the pixel array unit 3. More specifically, the pixel array unit 3 may be arranged with multiple pairs of phase difference pixels 2B of which aperture widths of the light shielding layers 47 (the widths in the pupil-split direction) are different.

<9. Modification of Aperture Direction of Light Shielding Layer>

Figure 15:
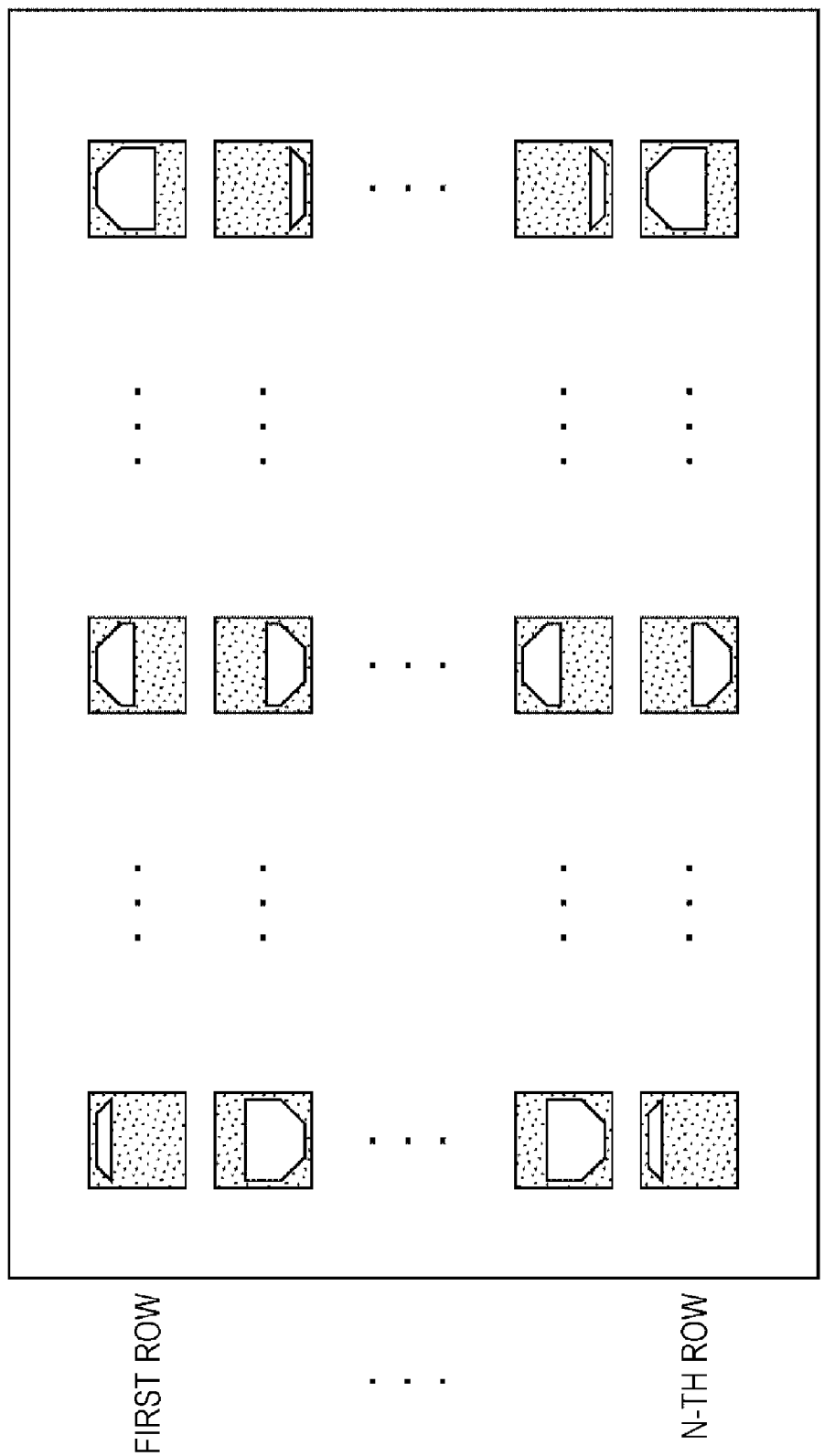
FIG. 15 is a figure illustrating modifications of aperture directions of phase difference pixels.

FIG. 14 is an example of pupil split in the left-right direction, and where the aperture direction of the aperture portion of the phase difference pixel 2B is adopted as the left-right direction. However, the aperture direction of the aperture portion is not limited to the left-right direction, and may be an upward/downward direction as shown in FIG. 15 or a diagonal direction (not shown).

Further, multiple phase difference pixels 2B of which aperture directions of the light shielding layers 47 are different may exist in a mixed manner in the pixel array unit 3, for example, phase difference pixels 2B of which aperture directions of the light shielding layers 47 are the upward/downward direction and phase difference pixels 2B of which aperture directions of the light shielding layers 47 are the left-right direction exist in a mixed manner.

<10. Modification of Aperture Shape of Light Shielding Layer>

Figure 16:
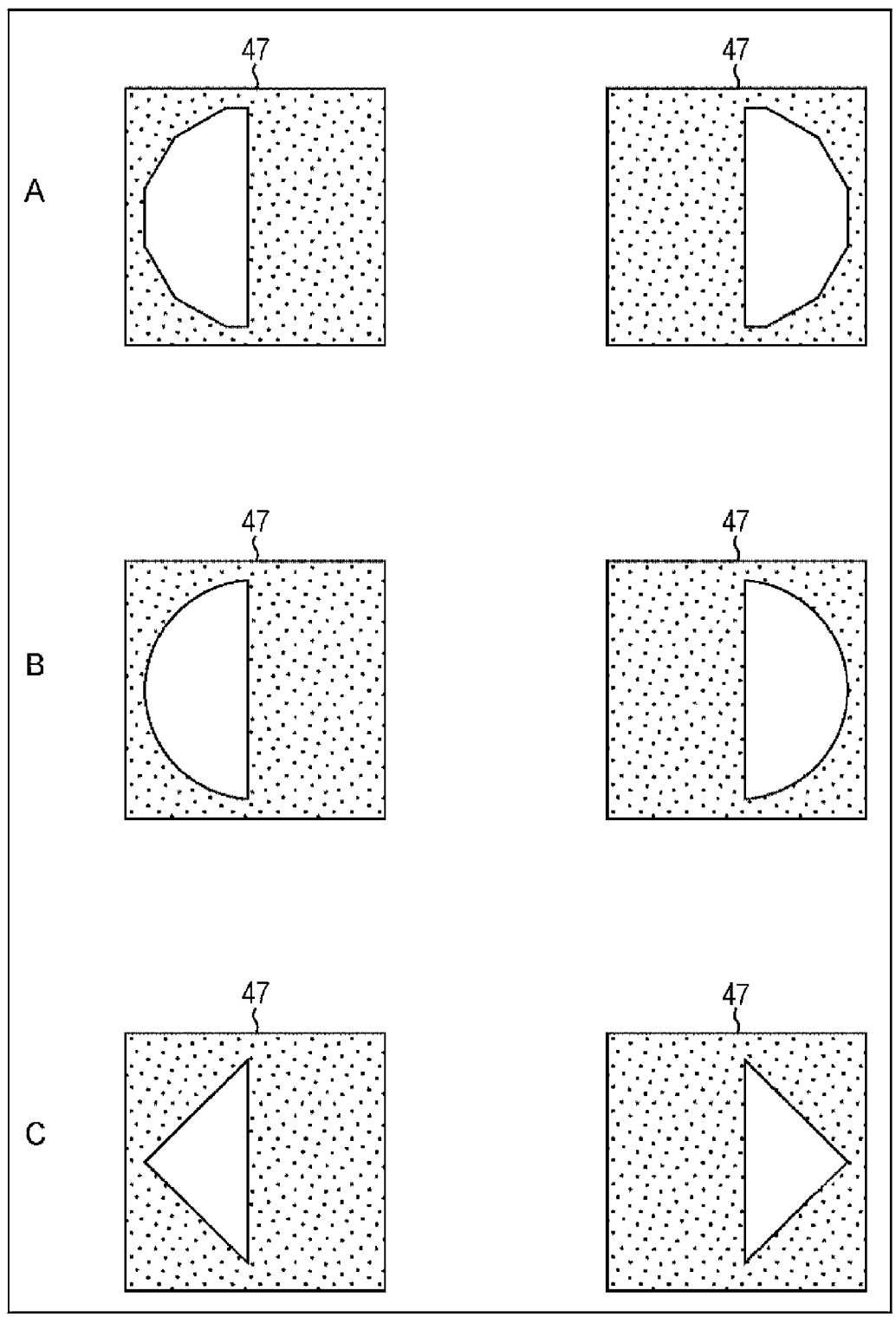
FIGS. 16A to 16C are figures illustrating modifications of aperture shapes of phase difference pixels.

FIGS. 16A to 16C illustrate other examples of aperture shapes of the light shielding layer 47 of the phase difference pixel 2B.

The aperture shape of the light shielding layer 47 of the phase difference pixel 2B is not limited to the hexagonal shape as shown in FIGS. 11C and 11D as long as it is a shape in which the areas in proximity to the four corners of the rectangular pixel area are narrowed. For example, the shapes as shown in FIGS. 16A to 16C can be employed as the aperture shapes of the light shielding layer 47 of the phase difference pixel 2B.

FIG. 16A illustrates an example where the aperture shape of the light shielding layer 47 of the phase difference pixel 2B is an octagonal shape which is a shape obtained by pupil-splitting a regular dodecagonal shape at a predetermined image height.

FIG. 16B illustrates an example where the aperture shape of the light shielding layer 47 of the phase difference pixel 2B is a semicircular shape which is a shape obtained by pupil-splitting a circular shape at a predetermined image height.

FIG. 16C illustrates an example where the aperture shape of the light shielding layer 47 of the phase difference pixel 2B is a triangular shape which is a shape obtained by pupil-splitting a rhombic shape at a predetermined image height.

<11. Example of Application to Front-Illuminated Type>

The pixel structure of the present disclosure is not limited to the back-illuminated-type. The pixel structure of the present disclosure can also be applied to a front-illuminated-type solid-state image-capturing device.

Figure 17:
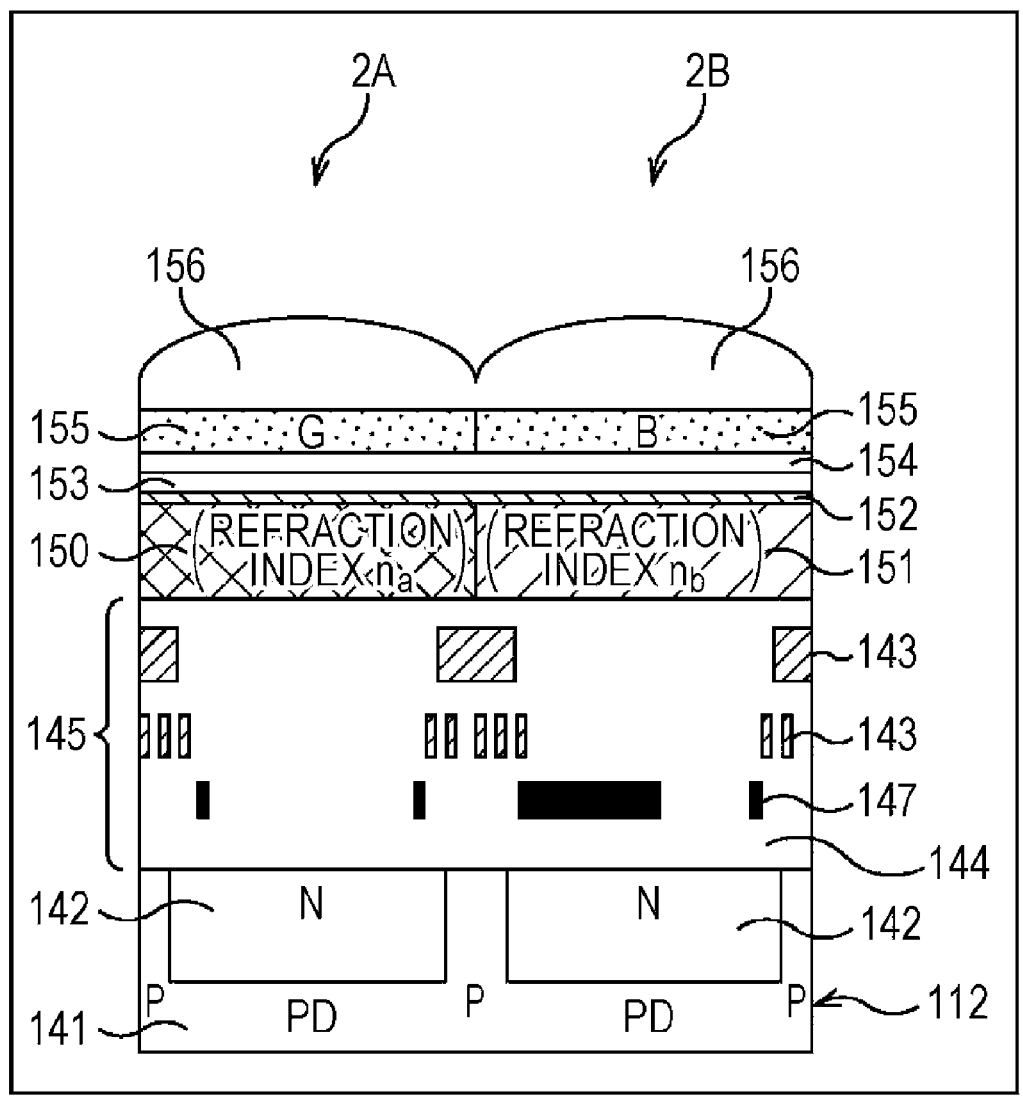
FIG. 17 is a cross sectional configuration diagram illustrating pixels in a case of a front-illuminated solid-state image-capturing device.

FIG. 17 illustrates a cross sectional configuration of the image-capturing pixel 2A and the phase difference pixel 2B in a case where the pixel structure of the present disclosure is applied to a front-illuminated-type solid-state image-capturing device.

In the solid-state image-capturing device 1, for example, a semiconductor area 142 of an N-type is formed in a semiconductor area 141 of a P-type of a semiconductor substrate 112 for each pixel 2, so that the photodiode PD is formed in units of pixels.

At the upper side of the semiconductor substrate 112, a multi-layer wire layer 145 is formed, which includes a light shielding layer 147, multiple wire layers 143, and a layer insulating film 144.

At the upper side of the multi-layer wire layer 145, a high refraction index layer 150 having a refraction index $n_a$ is formed in the area of the image-capturing pixel 2A, and a low refraction index layer 151 having a refraction index $n_b$ is formed in the area of the phase difference pixel 2B. In this case, the difference in the refraction index between the high refraction index layer 150 and the low refraction index layer 151 is equal to or more than 0.2

$$(n_a - n_b \geq 0.2).$$

Then, a reflection preventing film 152, a passivation film 153 made of nitride film (SiN), and a planarization film 154 are formed in order at the upper side of the high refraction index layer 150 and the low refraction index layer 151.

Further, a color filter layer 155 and a micro lens 156 are formed on the planarization film 154.

Figure 18:
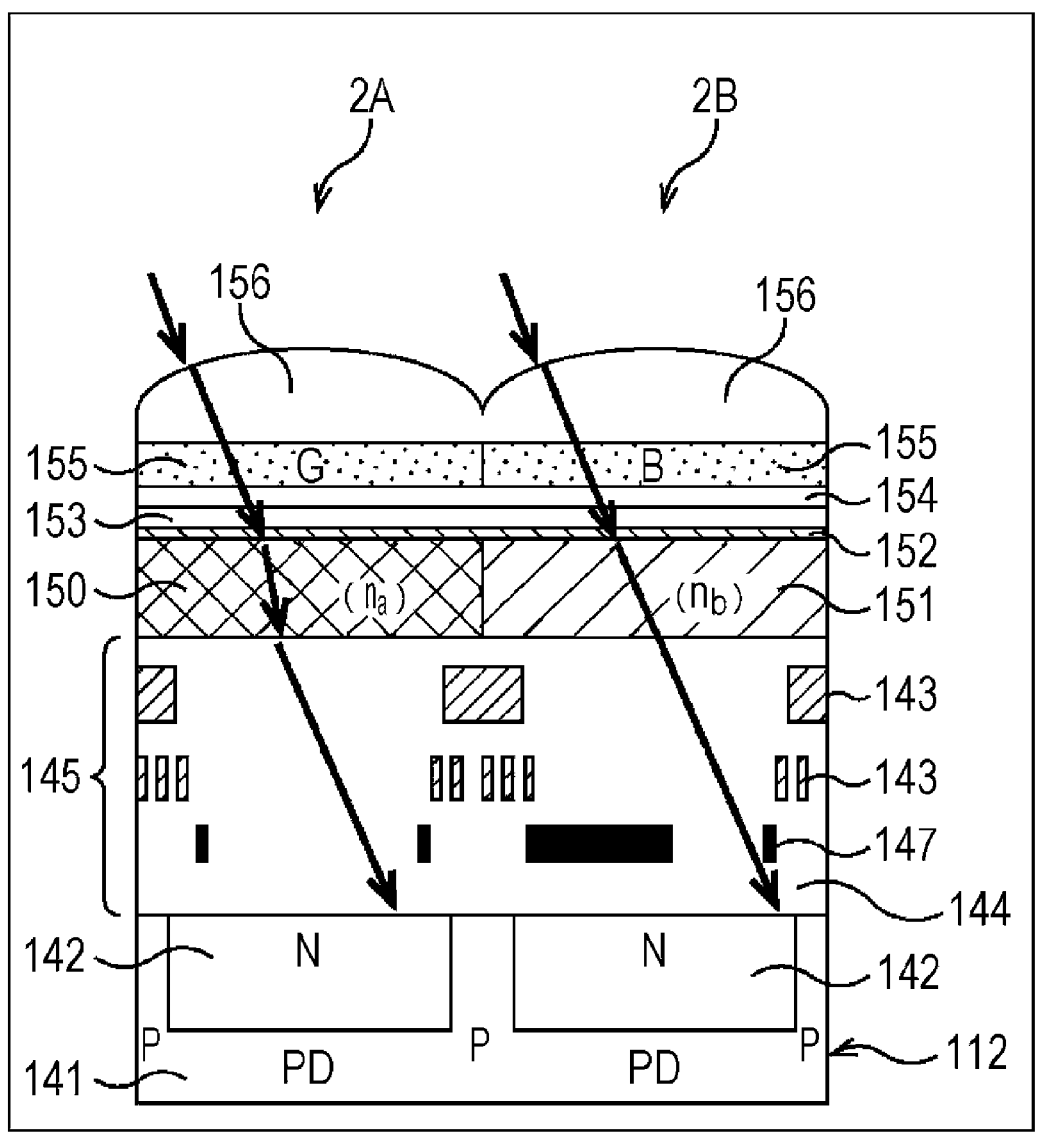
FIG. 18 is a figure for explaining diagonal incidence characteristic in a case of a front-illuminated solid-state image-capturing device.

FIG. 18 is a figure illustrating the state of propagation of diagonal incidence light in the cross sectional configuration diagram illustrating the image-capturing pixel 2A and the phase difference pixel 2B of front-illuminated-type.

In the front-illuminated-type solid-state image-capturing device, the high refraction index layer 150 is formed to be thicker in the image-capturing pixel 2A, and the low refraction index layer 151 is formed to be thicker in the phase difference pixel 2B. The difference in the refraction index between the high refraction index layer 150 of the image-capturing pixel 2A and the low refraction index layer 151 of the phase difference pixel 2B is configured to be equal to or more than 0.2. Accordingly, in the image-capturing pixel 2A, the angle dependency is reduced due to the refraction effect of the high refraction index layer 150, and in the phase difference pixel 2B, the angle dependency is enhanced due to the low refraction index layer 151. Therefore, according to the front-illuminated-type solid-state image-capturing device employing the pixel structure of the present disclosure, while a high degree of phase difference detection accuracy is realized in the phase difference pixel 2B, the degradation of the characteristic of the image-capturing pixel 2A can be reduced to the minimum.

In the example of FIGS. 17 and 18, the high refraction index layer 150 and the low refraction index layer 151 are formed to be thicker between the multi-layer wire layer 145 and the reflection preventing film 152, but the location (layer) where the high refraction index layer 150 and the low refraction index layer 151 are arranged may be any location between the multi-layer wire layer 145 and the micro lens 156 like the back-illuminated-type explained above.

In the example explained above, the solid-state image-capturing device has been explained in which the first conductivity-type is P-type, and the second conductivity-type is N-type, and the electrical charge is adopted as the signal electrical charge. Alternatively, the technique of the present disclosure can also be applied to a solid-state image-capturing device in which positive hole is adopted as signal electrical charge.

<12. Example of Configuration of Electronic Appliance According to an Embodiment of the Present Disclosure>

Further, the technique of the present disclosure is not limited to application to a solid-state image-capturing device. More specifically, the technique of the present disclosure can be applied to electronic appliances in general using a solid-state image-capturing device for an image retrieving unit (photoelectric conversion unit) such as an image-capturing device such as a digital still camera and a video camera, a portable terminal device having an image-capturing function, a copying machine using a solid-state image-capturing device for an image reading unit. The solid-state image-capturing device may be a mode formed as one-chip, or may be a module-like mode having an image-capturing function including an image-capturing unit, a signal processing unit, or an optical system packaged collectively.

Figure 19:
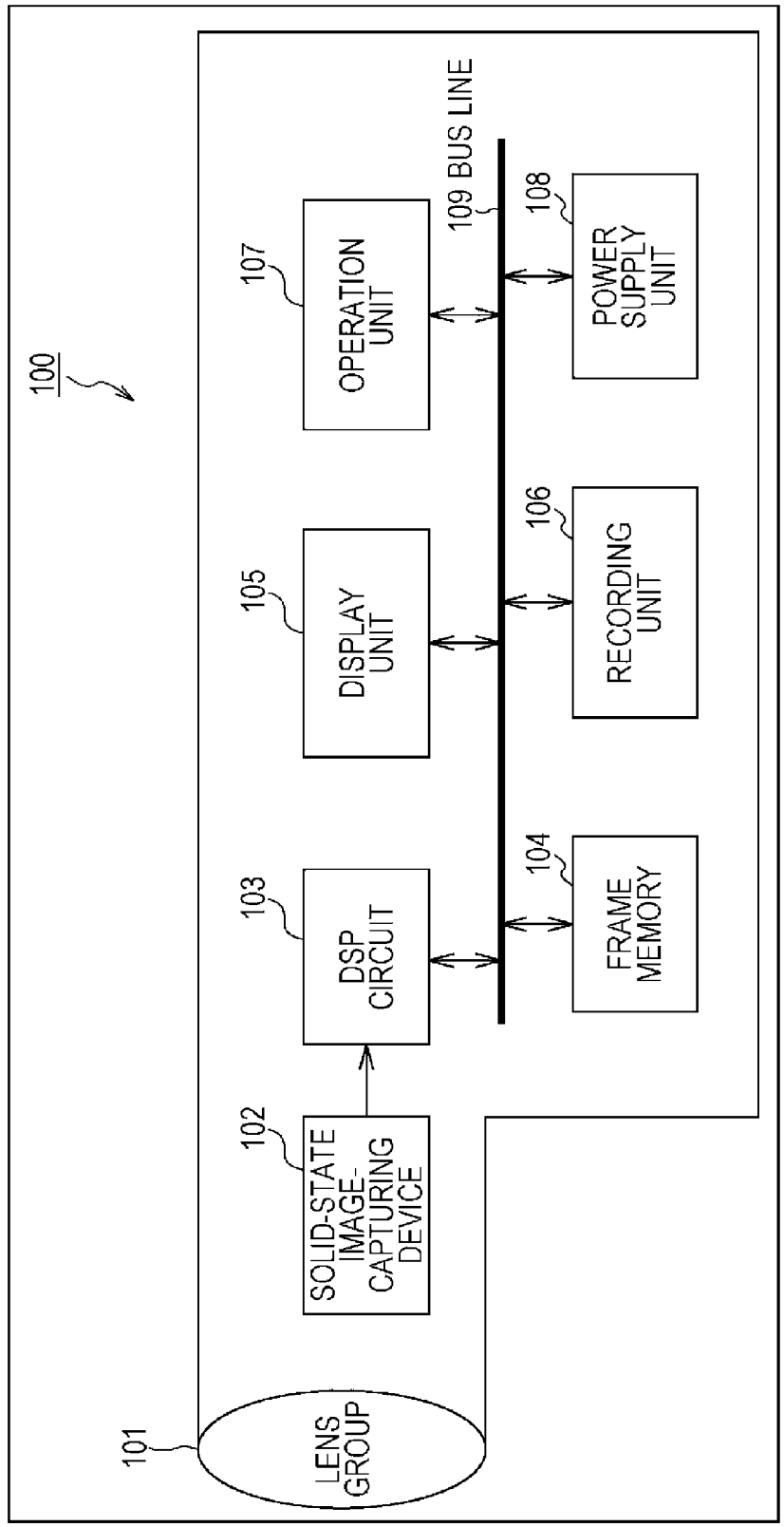
FIG. 19 is a block diagram illustrating an example of configuration of an image-capturing device as an electronic appliance according to an embodiment of the present disclosure.

FIG. 19 is a block diagram illustrating an example of configuration of an image-capturing device serving as an electronic appliance according to an embodiment of the present disclosure.

An image-capturing device 100 of FIG. 19 includes an optical unit 101 made of a lens group, a solid-state image-capturing device (image-capturing device) 102 employing the structure of the solid-state image-capturing device 1 of FIG. 1, and a DSP (Digital Signal Processor) circuit 103 which is a camera signal processing circuit. The image-capturing device 100 includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to each other via a bus line 109.

The optical unit 101 retrieves incidence light (image light) from a subject, and forms an image on an image-capturing surface of the solid-state image-capturing device 102. The solid-state image-capturing device 102 converts the light quantity of the incidence light condensed on the image-capturing surface by the optical unit 101 into an electric signal in units of pixels and outputs the electric signal as a pixel signal. As the solid-state image-capturing device 102, in the solid-state image-capturing device 1 of FIG. 1, that is, the phase difference pixel, while a high degree of phase difference detection accuracy is realized, the degradation of the characteristic of the image-capturing pixel can be reduced to the minimum.

The display unit 105 is made of, for example, a panel-type display device such as a liquid crystal panel and an organic EL (Electro Luminescence) panel and the like, and displays a motion picture or a still picture captured by the solid-state image-capturing device 102. The recording unit 106 records a motion picture or a still picture captured by the solid-state image-capturing device 102 to a recording medium such as a hard disk and a semiconductor memory.

The operation unit 107 transmits operation commands of various kinds of functions of the image-capturing device 100 according to a user's operation. The power supply unit 108 provides, as necessary, various kinds of power supplies serving as operating power supplies for the DSP circuit 103, the frame memory 104, the display unit 105, the recording unit 106, and the operation unit 107 to these targets to which the electric is to be supplied.

When the solid-state image-capturing device 1 explained above is used as the solid-state image-capturing device 102, the degradation of the characteristic of the image-capturing pixel can be reduced to a minimum while a high degree of phase difference detection accuracy is realized in the phase difference pixel. Therefore, the qualities of the captured images can be enhanced in the image-capturing device 100 such as a video camera, a digital still camera, further, a camera module for a mobile device such as a cellular phone.

The technique of the present disclosure is not limited to application to the solid-state image-capturing device for capturing an image by detecting distribution of incidence visible light quantity. The technique of the present disclosure can be applied to a solid-state image-capturing device for capturing, as an image, distribution of the quantity of incidence of infrared ray, X-ray, or particles, and a solid-state image-capturing device in general (physical quantity distribution detection device) such as a finger print detection sensor and the like for capturing an image by detecting distribution of other physical quantities such as pressures and capacitances in the broad sense.

The embodiments of the present disclosure is not limited to the embodiments explained above, and can be changed in various manners within the scope not deviating from the gist of the present disclosure.

It should be noted that the present disclosure can be configured as follows.

(1)

A solid-state image-capturing device including a pixel array unit in which a plurality of pixels including a phase difference pixel which is a pixel for focal point detection and an image-capturing pixel which is a pixel for image generation are arranged in an array form in a two-dimensional manner, wherein a predetermined layer between a light shielding layer and a micro lens formed in the image-capturing pixel has a higher refraction index than a refraction index of the predetermined layer formed in the phase difference pixel.

(2)

The solid-state image-capturing device according to the above (1), wherein a difference of the refraction index between the predetermined layer of the image-capturing pixel and the predetermined layer of the phase difference pixel is equal to or more than 0.2.

(3)

The solid-state image-capturing device according to the above (1) or (2), wherein the predetermined layer is provided between the micro lens and a color filter layer at an upper side of the light shielding layer.

(4)

The solid-state image-capturing device according to any one of the above (1) to (3), wherein a layer of which refraction index is less than that of the predetermined layer of the image-capturing pixel is further provided between the micro lens and the predetermined layer of the pixel.

(5)

The solid-state image-capturing device according to the above (1) or (2), wherein the predetermined layer is provided between the light shielding layer and a color filter layer at a lower side of the micro lens.

(6)

The solid-state image-capturing device according to the above (1) or (2), wherein the predetermined layer is a color filter layer.

(7)

The solid-state image-capturing device according to the above (6), wherein the predetermined layer of the phase difference pixel is a transparent color filter layer.

(8)

The solid-state image-capturing device according to the above (1) or (2), wherein the predetermined layer of the image-capturing pixel is a color filter layer, and the predetermined layer of the phase difference pixel is made of a same material as the micro lens.

(9)

The solid-state image-capturing device according to the above (1) or (2), wherein the predetermined layer of the phase difference pixel is made of a same material as a planarization film for planarizing an upper portion of the light shielding layer.

(10)

The solid-state image-capturing device according to any one of the above (1) to (9), wherein an aperture shape of the light shielding layer of the phase difference pixel is a shape in which areas in proximity to the four corners of a rectangular pixel area are narrowed.

(11)

The solid-state image-capturing device according to the above (10), wherein the aperture shape of the light shielding layer of the phase difference pixel is a polygonal shape.

(12)

The solid-state image-capturing device according to the above (10), wherein the aperture shape of the light shielding layer of the phase difference pixel is a semicircular shape.

(13)

The solid-state image-capturing device according to any one of the above (1) to (12), wherein there are a plurality of phase difference pixels of which aperture widths of the light shielding layers are different.

(14)

The solid-state image-capturing device according to any one of the above (1) to (13), wherein there are a plurality of phase difference pixels of which aperture directions of the light shielding layers are different.

(15)

A production method for producing a solid-state image-capturing device, wherein when a plurality of pixels including a phase difference pixel which is a pixel for focal point detection and an image-capturing pixel which is a pixel for image generation are formed, a predetermined layer between a light shielding layer and a micro lens formed in the image-capturing pixel is formed with a material having a higher refraction index than a refraction index of the predetermined layer formed in the phase difference pixel.

(16)

An electronic appliance including a solid-state image-capturing device including a pixel array unit in which a plurality of pixels including a phase difference pixel which is a pixel for focal point detection and an image-capturing pixel which is a pixel for image generation are arranged in an array form in a two-dimensional manner, wherein a predetermined layer between a light shielding layer and a micro lens formed in the image-capturing pixel has a higher refraction index than a refraction index of the predetermined layer formed in the phase difference pixel.

(17)

An electronic appliance including a solid-state image-capturing device including a pixel array unit in which a plurality of pixels including a phase difference pixel which is a pixel for focal point detection and an image-capturing pixel which is a pixel for image generation are arranged in an array form in a two-dimensional manner, wherein an aperture shape of the light shielding layer of the phase difference pixel is a shape for shielding light in areas in proximity to the four corners of a rectangular pixel area.

(18)

A solid-state image-capturing device including a pixel array unit having a plurality of pixels arranged in a two-dimensional array, the plurality of pixels including a phase difference pixel and an image-capturing pixel; and a layer between a light shielding layer and a micro lens formed in the image-capturing pixel, wherein the layer between the light shielding layer and the micro lens formed in the image-capturing pixel has a higher refraction index than a refraction index of a layer formed in the phase difference pixel.

(19)

The solid-state image-capturing device according to the above (18), wherein a difference between the refraction index of the layer between the light shielding layer and the micro lens of the image-capturing pixel and the refraction index of the layer of the phase difference pixel is greater than or equal to 0.2.

(20)

The solid-state image-capturing device according to the above (18) or (19), wherein the phase difference pixel includes a light shielding layer and a micro lens, and wherein at least one of the layer between the light shielding layer and the micro lens of the image-capturing pixel and the layer between the light shielding layer and the micro lens of the phase difference pixel is provided between the micro lens and a color filter at an upper side of the light shielding layer.

(21)

The solid-state image-capturing device according to any one of the above (18) to (20), wherein a second layer having a refraction index less than the refraction index of the layer between the light shielding layer and the micro lens of the image-capturing pixel is provided between the micro lens and the layer of the image-capturing pixel.

(22)

The solid-state image-capturing device according to the above (18) or (19), wherein the phase difference pixel includes a light shielding layer and a micro lens and wherein at least one of the layer between the light shielding layer and the micro lens of the image-capturing pixel and the layer between the light shielding layer and the micro lens of the phase difference pixel is provided between the light shielding layer and a color filter layer at a lower side of the micro lens.

(23)

The solid-state image-capturing device according to the above (18) or (19), wherein at least one of the layer between the light shielding layer and the micro lens of the image-capturing pixel and the layer between the light shielding layer and the micro lens of the phase difference pixel is a color filter layer.

(24)

The solid-state image-capturing device according to the above (23), wherein the layer between the light shielding layer and the micro lens of the phase difference pixel is a transparent color filter layer.

(25)

The solid-state image-capturing device according to the above (18) or (19), wherein the layer between the light shielding layer and the micro lens of the image-capturing pixel is a color filter layer, and the layer between the light shielding layer and the micro lens of the phase difference pixel is made of a same material as the micro lens.

(26)

The solid-state image-capturing device according to the above (18) or (19), wherein the layer between the light shielding layer and the micro lens of the phase difference pixel is made of a same material as a planarization film for planarizing an upper portion of the light shielding layer.

(27)

The solid-state image-capturing device according to any one of the above (18) to (26), wherein light incident upon a light shielding layer of the phase difference pixel forms at least two corner areas, and wherein an aperture shape of the light shielding layer of the phase difference pixel is a shape having at least two edges inset from the at least two corner areas.

(28)

The solid-state image-capturing device according to the above (27), wherein the aperture shape of the light shielding layer of the phase difference pixel is a polygonal shape.

(29)

The solid-state image-capturing device according to any one of the above (18) to (26), wherein an aperture shape of a light shielding layer of the phase difference pixel is a semicircular shape.

(30)

The solid-state image-capturing device according to any one of the above (18) to (29), wherein the plurality of pixels include a plurality of phase difference pixels having light shielding layers of different aperture widths.

(31)

The solid-state image-capturing device according to any one of the above (18) to (30), wherein the plurality of pixels include a plurality of phase difference pixels having light shielding layers of different aperture directions.

(32)

The solid-state image-capturing device according to any one of the above (18) to (31), wherein the phase difference pixel is a pixel for focal point detection and the image-capturing pixel which is a pixel for image generation.

(33)

The solid-state image-capturing device according to any one of the above (18) to (32), wherein the layer formed in the phase difference pixel is a layer formed between a light shielding layer and a micro lens of the phase difference pixel.

(34)

A production method for producing a solid-state image-capturing device having a plurality of pixels including a phase difference pixel and an image-capturing pixel, the method including forming a light shielding layer in at least the image-capturing pixel; forming a first layer in the image-capturing pixel with a material having a higher refraction index than a refraction index of a first in the phase difference pixel; and forming a micro lens above the first layer.

(35)

An electronic appliance including a solid-state image-capturing device including a pixel array unit having a plurality of pixels including a phase difference pixel and an image-capturing pixel arranged in a two-dimensional array; and a layer between a light shielding layer and a micro lens formed in the image-capturing pixel, wherein the layer between the light shielding layer and the micro lens formed in the image-capturing pixel has a higher refraction index than a refraction index of a layer formed in the phase difference pixel.

(36)

An electronic appliance including a solid-state image-capturing device including a pixel array unit having a plurality of pixels including a phase difference pixel and an image-capturing pixel arranged in a two-dimensional array, wherein an aperture shape of a light shielding layer of the phase difference pixel is a shape for shielding light in areas in proximity to the four corners of a rectangular pixel area.

REFERENCE SIGNS LIST 1 solid-state image-capturing device
2A image-capturing pixel
2B phase difference pixel
3 pixel array unit
47 light shielding layer
48 planarization film
49 color filter layer
50 high refractive index layer
51 low refractive index layer
52 micro lens
81 planarization film
100 image-capturing device
102 solid-state image-capturing device

The invention claimed is:

1. A solid-state image-capturing device, comprising:
a pixel array unit having a plurality of pixels arranged in a two-dimensional array, the plurality of pixels including a first pixel and a second pixel;
a first layer between a light shielding layer and a micro lens formed in the first pixel; and
a second layer between the light shielding layer and a micro lens formed in the second pixel,
wherein the first layer is not between the light shielding layer and the micro lens formed in the second pixel,
wherein the second layer is not between the light shielding layer and the micro lens formed in the first pixel, and
wherein the second layer between the light shielding layer and the micro lens formed in the second pixel has a higher refraction index than a refraction index of the first layer formed in the first pixel.

2. The solid-state image-capturing device according to claim 1, wherein a difference between the refraction index of the second layer between the light shielding layer and the micro lens of the second pixel and the refraction index of the first layer of the first pixel is greater than or equal to 0.2.

3. The solid-state image-capturing device according to claim 1, wherein a planarization film having a refraction index less than the refraction index of the second layer between the light shielding layer and the micro lens of the second pixel is provided between the micro lens and the second layer of the second pixel.

4. The solid-state image-capturing device according to claim 1, wherein at least one of the second layer between the light shielding layer and the micro lens of the second pixel and the first layer between the light shielding layer and the micro lens of the first pixel is provided between the light shielding layer and a color filter layer at a lower side of the micro lens.

5. The solid-state image-capturing device according to claim 1, wherein the first layer between the light shielding layer and the micro lens of the first pixel is made of a same material as a planarization film for planarizing an upper portion of the light shielding layer.

6. The solid-state image-capturing device according to claim 1, wherein light incident upon the light shielding layer of the first pixel forms at least two corner areas, and wherein an aperture shape of the light shielding layer of the first pixel is a shape having at least two edges inset from the at least two corner areas.

7. The solid-state image-capturing device according to claim 6, wherein the aperture shape of the light shielding layer of the first pixel is a polygonal shape.

8. The solid-state image-capturing device according to claim 1, wherein an aperture shape of the light shielding layer of the first pixel is a semicircular shape.

9. The solid-state image-capturing device according to claim 1, wherein the plurality of pixels include a plurality of first pixels, and wherein the first pixels are phase difference pixels having light shielding layers forming a different aperture than at least an aperture width of the second pixel.

10. The solid-state image-capturing device according to claim 1, wherein the plurality of pixels include a plurality of first pixels, and wherein the first pixels are phase difference pixels having light shielding layers of different aperture directions.

11. The solid-state image-capturing device according to claim 1, wherein the first pixel is a pixel for focal point detection and the second pixel is a pixel for image generation.

12. A production method for producing a solid-state image-capturing device having a plurality of pixels including a first pixel and a second pixel, the method comprising:
forming a light shielding layer in at least the first pixel;
forming a first layer in the first pixel at a first distance from the light shielding layer in a direction perpendicular to a back surface of a substrate, wherein the first layer is between the light shielding layer and a micro lens formed in the first pixel;
forming a second layer in the second pixel at the first distance from the light shielding layer in the direction perpendicular to the back surface of the substrate, wherein the second layer is between the light shielding layer and a micro lens formed in the second pixel, wherein the first layer is not between the light shielding layer and the micro lens formed in the second pixel, wherein the second layer is not between the light shielding layer and the micro lens formed in the first pixel, wherein a material of the second layer has a higher refraction index than a refraction index of a material of the first layer in the first pixel.

13. An electronic appliance comprising a solid-state image-capturing device including a pixel array unit having a plurality of pixels including a first pixel and a second pixel arranged in a two-dimensional array;
   a first layer between a light shielding layer and a micro lens formed in the first pixel; and
   a second layer between the light shielding layer and a micro lens formed in the second pixel, wherein the first layer is not between the light shielding layer and the micro lens formed in the second pixel, wherein the second layer is not between the light shielding layer and the micro lens formed in the first pixel, wherein the second layer between the light shielding layer and the micro lens formed in the second pixel has a higher refraction index than a refraction index of the first layer formed between the light shielding layer and the micro lens formed in the first pixel, and wherein the second layer between the light shielding layer and the micro lens formed in the second pixel is horizontally adjacent to the first layer formed in the first pixel.

14. An electronic appliance comprising a solid-state image-capturing device including a pixel array unit having a plurality of first pixels and a plurality of second pixels arranged in a two-dimensional array,
   wherein the first pixels include a low refraction index layer formed on a first one of a light shielding layer and a color filter layer,
   wherein the low refraction index layer is between the light shielding layer and a micro lens formed in the first pixels,
   wherein the second pixels include a high refraction index layer formed on the first one of the light shielding layer and the color filter layer,
   wherein the high refraction index layer is between the light shielding layer and a micro lens formed in the second pixels,
   wherein the low refraction index layer is not between the light shielding layer and the micro lens formed in the second pixels,
   wherein the high refraction index layer is not between the light shielding layer and the micro lens formed in the first pixels, and
   wherein an aperture shape of the light shielding layer of the first pixels is a shape for shielding light in areas in proximity to the four corners of a rectangular pixel area.

* * * * *